US012563818B2

(12) United States Patent
Chen et al.

(10) Patent No.: US 12,563,818 B2
(45) Date of Patent: *Feb. 24, 2026

(54) METHODS OF FORMING SEMICONDUCTOR DEVICES

(71) Applicant: Taiwan Semiconductor Manufacturing Company, Ltd., Hsinchu (TW)

(72) Inventors: Chien-Yuan Chen, Hsinchu (TW); Jui-Ping Lin, Hsinchu (TW); Chen-Ming Lee, Yangmei (TW); Fu-Kai Yang, Hsinchu (TW); Mei-Yun Wang, Chu-Pei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/638,343

(22) Filed: Apr. 17, 2024

(65) Prior Publication Data

US 2024/0266228 A1     Aug. 8, 2024

Related U.S. Application Data

(63) Continuation of application No. 18/189,437, filed on Mar. 24, 2023, now Pat. No. 11,990,378, which is a
(Continued)

(51) Int. Cl.
H10D 84/03        (2025.01)
H01L 21/033       (2006.01)
(Continued)

(52) U.S. Cl.
CPC ....... *H10D 84/038* (2025.01); *H01L 21/0337* (2013.01); *H01L 21/31144* (2013.01);
(Continued)

(58) Field of Classification Search
None
See application file for complete search history.

(56) References Cited

U.S. PATENT DOCUMENTS 9,105,490 B2     8/2015   Wang et al.
9,236,267 B2     1/2016   De et al.
(Continued)

FOREIGN PATENT DOCUMENTS

CN          106505096 A     3/2017
CN          107871739 A     4/2018
(Continued)

*Primary Examiner* — Sarah K Salerno
(74) *Attorney, Agent, or Firm* — Slater Matsil, LLP

(57) ABSTRACT

An embodiment method includes: forming fins extending from a semiconductor substrate; depositing an inter-layer dielectric (ILD) layer on the fins; forming masking layers on the ILD layer; forming a cut mask on the masking layers, the cut mask including a first dielectric material, the cut mask having first openings exposing the masking layers, each of the first openings surrounded on all sides by the first dielectric material; forming a line mask on the cut mask and in the first openings, the line mask having slot openings, the slot openings exposing portions of the cut mask and portions of the masking layers, the slot openings being strips extending perpendicular to the fins; patterning the masking layers by etching the portions of the masking layers exposed by the first openings and the slot openings; and etching contact openings in the ILD layer using the patterned masking layers as an etching mask.

20 Claims, 26 Drawing Sheets

Related U.S. Application Data continuation of application No. 17/705,943, filed on Mar. 28, 2022, now Pat. No. 11,615,991, which is a continuation of application No. 16/884,972, filed on May 27, 2020, now Pat. No. 11,289,383.

(51) Int. Cl.

| | | |
|---|---|---|
| *H01L 21/311* | (2006.01) | |
| *H10D 84/01* | (2025.01) | |
| *H10D 84/85* | (2025.01) | |

(52) U.S. Cl.
CPC ..... *H10D 84/0186* (2025.01); *H10D 84/0193* (2025.01); *H10D 84/853* (2025.01)

(56) References Cited

U.S. PATENT DOCUMENTS

| | | | |
|---|---|---|---|
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,722,050 | B2 | 8/2017 | Li et al. |
| 9,831,183 | B2 | 11/2017 | Lin et al. |
| 9,859,386 | B2 | 1/2018 | Ho et al. |
| 10,043,800 | B2 | 8/2018 | Kim et al. |
| 10,164,106 | B2 | 12/2018 | Huang et al. |
| 10,204,996 | B2 | 2/2019 | Hsiao et al. |
| 10,490,459 | B2 | 11/2019 | Koh et al. |
| 10,699,960 | B2 | 6/2020 | Su et al. |
| 11,004,788 | B2 | 5/2021 | Jun et al. |
| 11,107,902 | B2 | 8/2021 | Chen et al. |
| 11,289,383 | B2 * | 3/2022 | Chen ................. H01L 21/31144 |
| 2010/0308381 | A1 * | 12/2010 | Luning ................ H10D 86/215 |
| | | | 257/E21.135 |
| 2017/0033101 | A1 | 2/2017 | Sharma et al. |
| 2017/0194203 | A1 * | 7/2017 | Hung ...................... H01L 28/00 |
| 2017/0255735 | A1 | 9/2017 | Kim et al. |
| 2018/0083002 | A1 | 3/2018 | Kim et al. |
| 2019/0067130 | A1 | 2/2019 | Koh et al. |
| 2020/0135546 | A1 | 4/2020 | Wang et al. |

FOREIGN PATENT DOCUMENTS

| | | |
|---|---|---|
| CN | 109427896 A | 3/2019 |
| KR | 20180032359 A | 3/2018 |
| KR | 20180078125 A | 7/2018 |
| KR | 20190022253 A | 3/2019 |
| KR | 20190138012 A | 12/2019 |
| TW | 201714306 A | 4/2017 |
| TW | 201725725 A | 7/2017 |
| TW | 201914008 A | 4/2019 |
| TW | 202002280 A | 1/2020 |
| TW | 202016982 A | 5/2020 |

* cited by examiner

50N/50P 74
72
64

62

60

50

56

58   52

56

58   52

56

50N/50P 74
72
64

62
60

52

50

70

66

58

66

70

50N/50P

62

60

50

56

58   52

56

58   52

56

50N/50P 72  74

70

66

58

66

70

62
60

52

50

METHODS OF FORMING SEMICONDUCTOR DEVICES

PRIORITY CLAIM AND CROSS-REFERENCE

This application is a continuation of U.S. patent application Ser. No. 18/189,437, filed on Mar. 24, 2023, entitled "Semiconductor Device and Method," which is a continuation of U.S. patent application Ser. No. 17/705,943, filed on Mar. 28, 2022, entitled "Semiconductor Device and Method," now U.S. Pat. No. 11,615,991, issued on Mar. 28, 2023, which is a continuation of U.S. patent application Ser. No. 16/884,972, filed on May 27, 2020, entitled "Semiconductor Device and Method," now U.S. Pat. No. 11,289,383, issued on Mar. 29, 2022, which are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
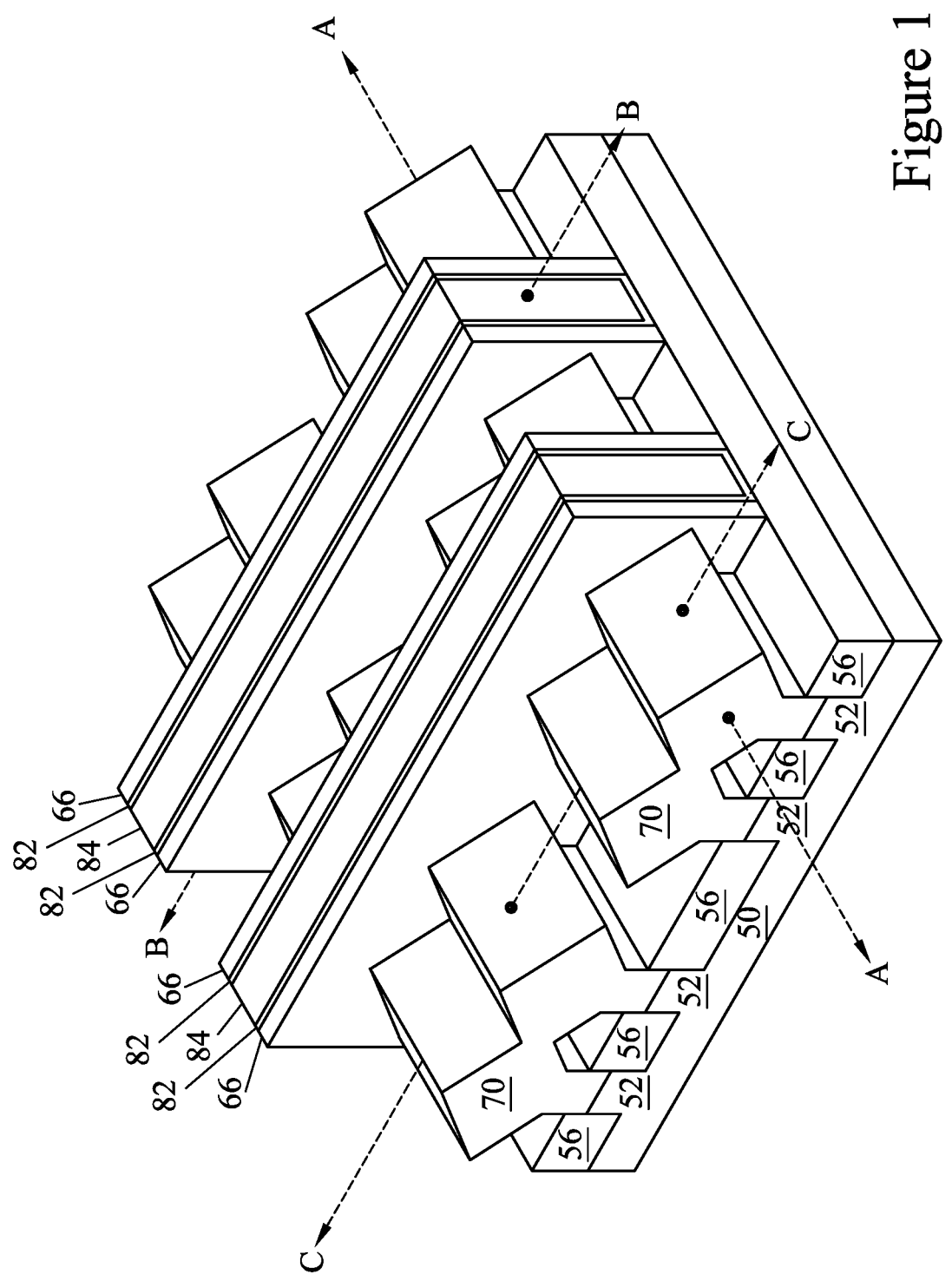
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments a cut mask and a line mask are used in combination to define regions in which contacts will be formed in a dielectric layer, such as an inter-layer dielectric (ILD) layer. The line mask has slotted openings that extend a first direction, and the cut mask has dielectric lines that extend in a perpendicular second direction, intersecting the slotted openings. The slotted openings define regions in which contacts will be formed, and the dielectric lines define regions in which contacts will not be formed. The line mask further includes trim portions that extend in the first direction, and define additional areas in which contacts will not be formed. Specifically, unused areas that would otherwise contain dummy contacts are excluded from contact formation with the trim portions of the line mask. By reducing the amount of dummy contacts, a parasitic capacitance on other conductive features may be avoided. Reducing the parasitic capacitance of the FinFETs can be particularly advantageous for some applications, such as ring oscillators, where performance can be improved by up to 1%.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as two transistors.

The FinFETs comprise fins 52 extending from a substrate 50. Shallow trench isolation (STI) regions 56 are disposed over the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may comprise a single material or a plurality of materials. In this context, the fins 52 refers to the portions extending between the neighboring STI regions 56.

Gate dielectrics 82 are along sidewalls and over top surfaces of the fins 52, and gate electrodes 84 are over the gate dielectrics 82. Source/drain regions 70 are disposed in opposite sides of the fin 52 with respect to the gate dielectrics 82 and gate electrodes 84. Gate spacers 66 separate the source/drain regions 70 from the gate dielectrics 82 and gate electrodes 84. In embodiments where multiple transistors are formed, the source/drain regions 70 may be shared between various transistors. In embodiments where one transistor is formed from multiple fins 52, neighboring source/drain regions 70 may be electrically connected, such as through coalescing the source/drain regions 70 by epitaxial growth, or through coupling the source/drain regions 70 with a same source/drain contact.

FIG. 1 further illustrates several reference cross-sections. Cross-section A-A is along a longitudinal axis of the fin 52 and in a direction of, for example, a current flow between the source/drain regions 70 of a FinFET. Cross-section B-B is perpendicular to cross-section A-A and is along a longitudinal axis of the gate electrodes 84. Cross-section C-C is perpendicular to cross-section A-A and extends through source/drain regions 70 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2A through 5B are cross-sectional views of intermediate stages in the manufacturing of FinFETs, in accordance with some embodiments. FIGS. 2A, 3A, 4A, and 5A are cross-sectional views illustrated along reference cross-section A-A in FIG. 1, except for multiple fins/FinFETs. FIGS. 2B, 3B, 4B, and 5B are cross-sectional views illustrated along reference cross-section B-B in FIG. 1, except for multiple fins/FinFETs. FIGS. 2C and 2D are cross-sectional views illustrated along reference cross-section C-C in FIG. 1, except for multiple fins/FinFETs.

Figure 2B:
FIGS. 2A through 5B are various views of intermediate stages in the manufacturing of FinFETs, in accordance with some embodiments.
Figure 2B:
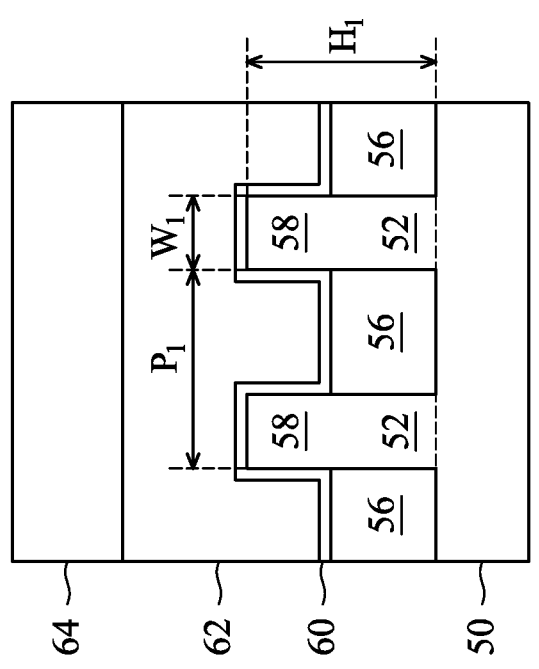
Figure 2A:
Figure 2A:
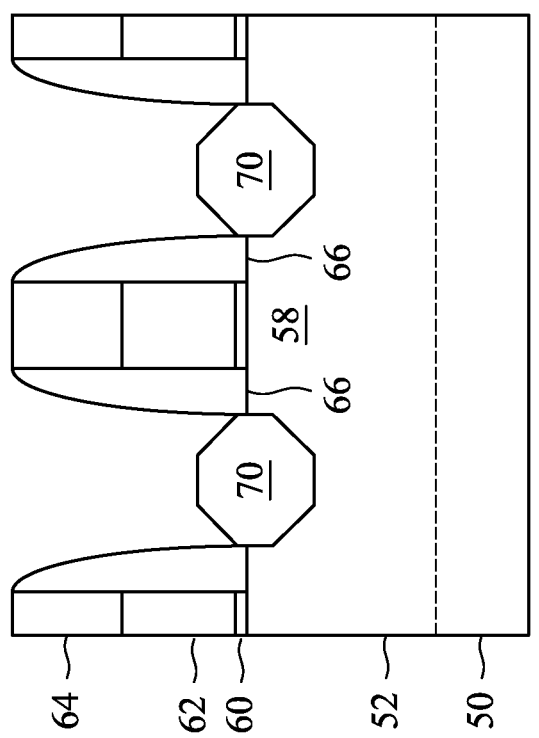

In FIGS. 2A and 2B, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. For example, when p-type devices are formed, the substrate 50 may be a strained material such as silicon germanium ($Si_xGe_{1-x}$, where x can be in the range of 0 to 1) having a germanium concentration in the range of about 0% to about 40%, such that FinFETs with p-type fully strained channel (PFSC) regions are formed.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

Fins 52 are formed extending from the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. After formations, the fins 52 have a width $W_1$, and fins 52 in a same region 50N/50P are spaced apart by a pitch $P_1$. The width $W_1$ can be in the range of about 11 nm to about 14 nm, and the pitch $P_1$ can be in the range of about 55 nm to about 60 nm.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

STI regions 56 are formed over the substrate 50 and between neighboring fins 52. As an example to form the STI regions 56, an insulation material is formed over the intermediate structure. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52. Some embodiments may utilize multiple layers. For example, in some embodiments a liner (not shown) may first be formed along a surface of the substrate 50 and the fins 52. Thereafter, a fill material, such as those discussed above may be formed over the liner. A removal process is applied to the insulation material to remove excess insulation material over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material are level after the planarization process is complete. The insulation material is then recessed, with remaining portions of the insulation material forming the STI regions 56. The insulation material is recessed such that upper portions of fins 52 in the region 50N and in the region 50P protrude from between neighboring STI regions 56. After the recessing, exposed portions of the fins 52 extend a height $H_1$ above top surfaces of the STI regions 56. The height $H_1$ can be greater than about 40 nm, such as in the range of about 50 nm to about 80 nm. The exposed portions of the fins 52 include what will be channel regions of the resulting FinFETs.

Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, a chemical oxide removal with a suitable etch process using, for example, dilute hydrofluoric (dHF) acid may be used.

The process described above is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, after the insulation material of the STI regions 56 is planarized with the fins 52, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Dummy gate dielectrics 60 are formed over the fins 52 and dummy gates 62 are formed over the dummy gate dielectrics 60. The dummy gate dielectrics 60 and dummy gates 62 may be collectively referred to as "dummy gate stacks," with each dummy gate stack including a dummy gate dielectric 60 and a dummy gate 62. The dummy gate stacks extend along sidewalls of the fins 52. Although only one dummy gate stack is illustrated, it should be appreciated that multiple dummy gate stack are simultaneously formed, and each fin 52 may have multiple dummy gate stacks formed thereon.

As an example of forming the dummy gate dielectrics 60 and dummy gates 62, a dummy dielectric layer is formed on the fins 52. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The dummy gate layer may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer may be deposited by physical vapor deposition (PVD), CVD, sputter deposition, or other techniques known and used in the art for depositing conductive materials. The dummy gate layer may be made of other materials that have a high etching selectivity from the etching of isolation regions. The mask layer may include, for example, silicon nitride, silicon oxynitride, or the like. In this example, a single dummy gate layer and a single mask layer are formed across the region 50N and the region 50P. It is noted that the dummy dielectric layer is shown covering only the fins 52 for illustrative purposes only. In some embodiments, the dummy dielectric layer may be deposited such that the dummy dielectric layer covers the STI regions 56, extending between the dummy gate layer and the STI regions 56. The mask layer is then patterned using acceptable photolithography and etching techniques to form masks 64. The pattern of the masks 64 is then transferred to the dummy gate layer by an acceptable etching technique to form dummy gates 62. The pattern of the masks 64 is further transferred to the dummy dielectric layer to form dummy gate dielectrics 60. The dummy gates 62 cover respective channel regions of the fins 52. The pattern of the masks 64 may be used to physically separate each of the dummy gates 62 from adjacent dummy gates. The dummy gates 62 may also have a lengthwise direction substantially perpendicular to the lengthwise direction of respective fins 52.

Gate spacers 66 are formed on exposed surfaces of the dummy gates 62, the masks 64, and/or the fins 52. The gate spacers 66 may be formed by conformally depositing an insulating material and subsequently etching the insulating material. The insulating material of the gate spacers 66 may be silicon nitride, silicon carbon nitride, a combination thereof, or the like. In some embodiments (not shown), the gate spacers 66 are formed from a multi-layered insulating material, and include multiple layers. For example, the gate spacers 66 may include multiple layers of silicon nitride, or may include a layer of silicon oxide disposed between two layers of silicon nitride. The etching of the gate spacers 66 can be anisotropic. After etching, the gate spacers 66 can have straight sidewalls or curved sidewalls.

Before or during the formation of the gate spacers 66, implants for lightly doped source/drain (LDD) regions (not explicitly illustrated) may be performed. In the embodiments with different device types, similar to the implants discussed, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type (e.g., n-type) impurities may be implanted into the exposed fins 52 in the region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ $cm^{-3}$ to about $10^{16}$ $cm^{-3}$. An anneal may be used to activate the implanted impurities.

Epitaxial source/drain regions 70 are then formed in the fins 52. The epitaxial source/drain regions 70 are formed in the fins 52 such that the dummy gates 62 are disposed between respective neighboring pairs of the epitaxial source/drain regions 70. In some embodiments the epitaxial source/drain regions 70 may extend into portions of the fins 52 beneath the top surfaces of the STI regions 56. In some embodiments, the gate spacers 66 are used to separate the epitaxial source/drain regions 70 from the dummy gates 62 by an appropriate lateral distance so that the epitaxial source/drain regions 70 do not short out subsequently formed gates of the resulting FinFETs. The epitaxial source/drain regions 70 can exert stress in respective channel regions 58 of the fins 52, thereby improving performance.

Figure 2D:
Figure 2D:
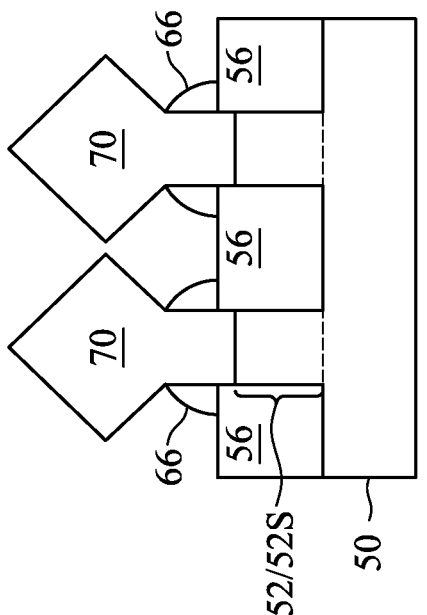
Figure 2C:
Figure 2C:
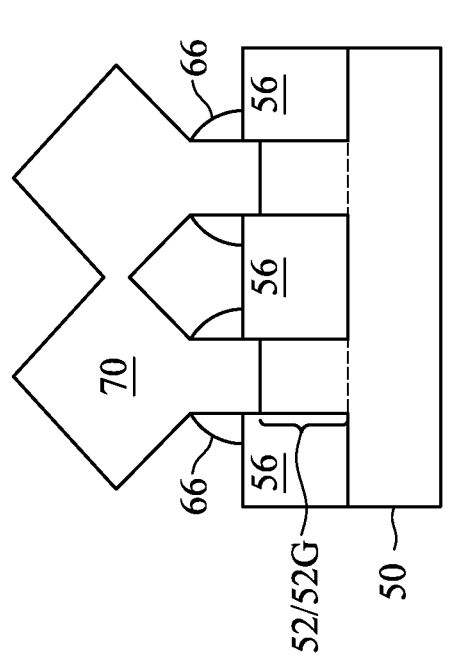

As a result of the epitaxy processes used to form the epitaxial source/drain regions 70, upper surfaces of the epitaxial source/drain regions 70 have facets which expand laterally outward beyond sidewalls of the fins 52. In some embodiments, these facets cause adjacent epitaxial source/ drain regions 70 of a same FinFET to merge as illustrated by FIG. 2C. For example, merged epitaxial source/drain regions 70 may be formed when one transistor is formed from multiple fins, e.g., a fin group 52G. In other embodiments, adjacent source/drain regions 70 remain separated after the epitaxy process is completed as illustrated by FIG. 2D. For example, unmerged epitaxial source/drain regions 70 may be formed when one transistor is formed from a single fin 52S. In the embodiments illustrated in FIGS. 2C and 2D, gate spacers 66 are formed covering a portion of the sidewalls of the fins 52 that extend above the STI regions 56, thereby blocking the epitaxial growth. In some other embodiments, the spacer etch used to form the gate spacers 66 may be adjusted to remove the spacer material to allow the epitaxially grown region to extend to the surface of the STI region 56.

Figure 3B:
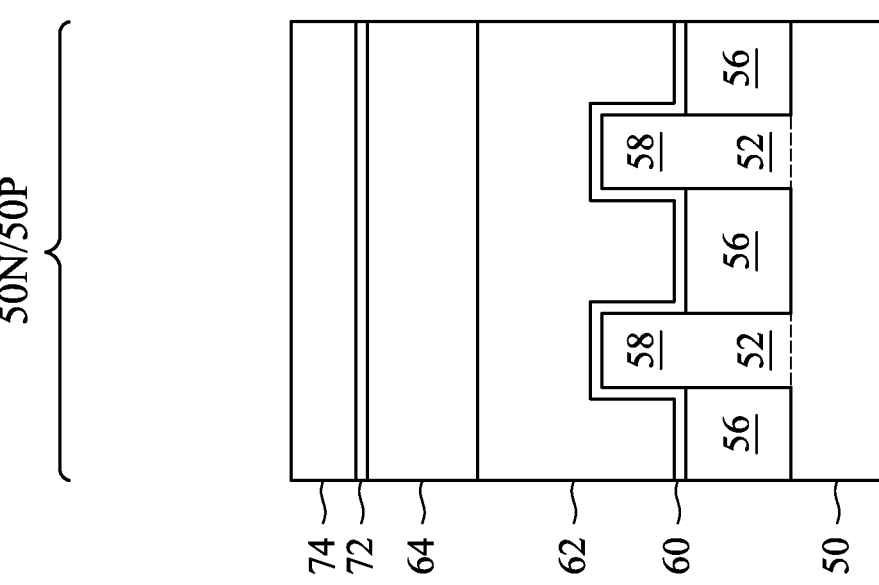
Figure 3A:
Figure 3A:
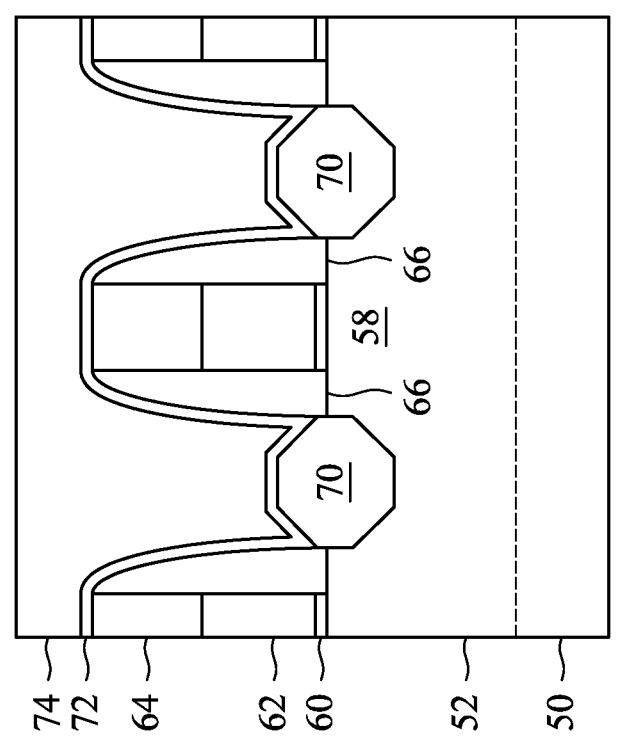

In FIGS. 3A and 3B, a first ILD layer 74 is deposited over the intermediate structure. The first ILD layer 74 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 72 is disposed between the first ILD layer 74 and the epitaxial source/drain regions 70, the masks 64, and the gate spacers 66. The CESL 72 may comprise a dielectric material, such as, silicon nitride, silicon oxide, silicon oxynitride, or the like, having a different etch rate than the material of the first ILD layer 74.

Figure 4B:
Figure 4B:
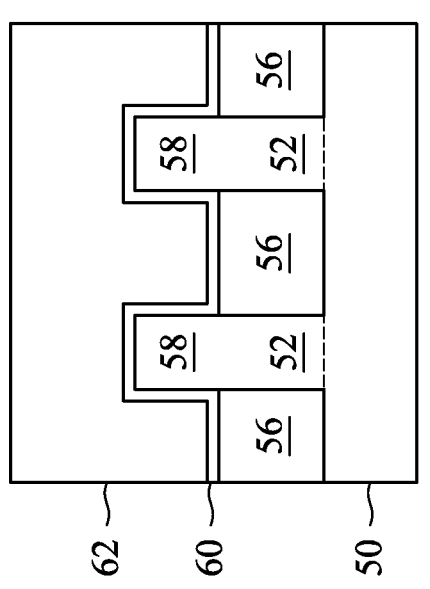
Figure 4A:
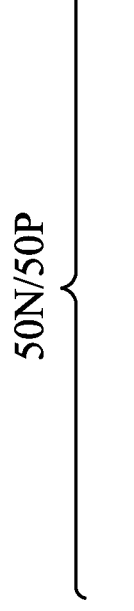
Figure 4A:
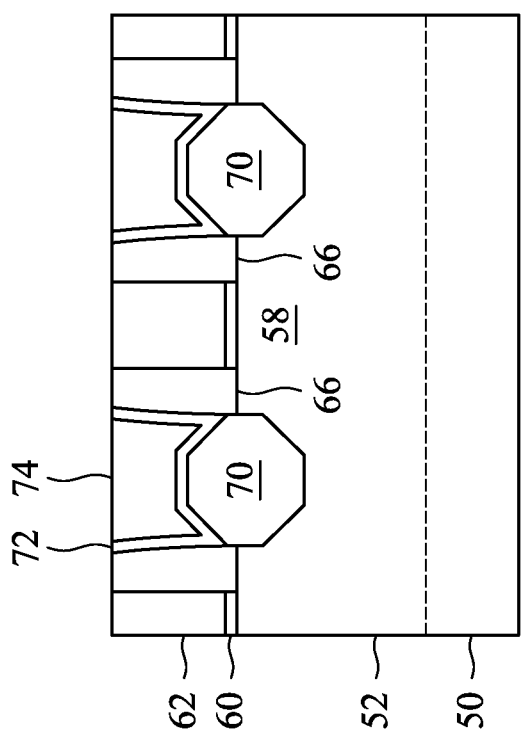

In FIGS. 4A and 4B, a planarization process, such as a CMP, may be performed to level the top surface of the first ILD layer 74 with the top surfaces of the dummy gates 62 or the masks 64. The planarization process may also remove the masks 64 on the dummy gates 62, and portions of the gate spacers 66 along sidewalls of the masks 64. After the planarization process, top surfaces of the dummy gates 62, the gate spacers 66, and the first ILD layer 74 are level. Accordingly, the top surfaces of the dummy gates 62 are exposed through the first ILD layer 74. In some embodiments, the masks 64 may remain, in which case the planarization process levels the top surface of the first ILD layer 74 with the top surfaces of the masks 64.

Figure 5B:
Figure 5B:
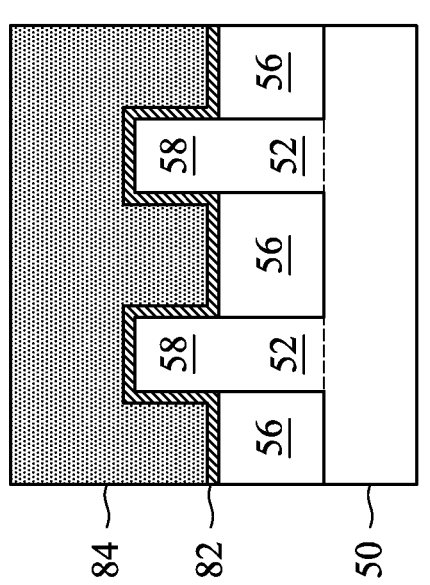
Figure 5A:
Figure 5A:
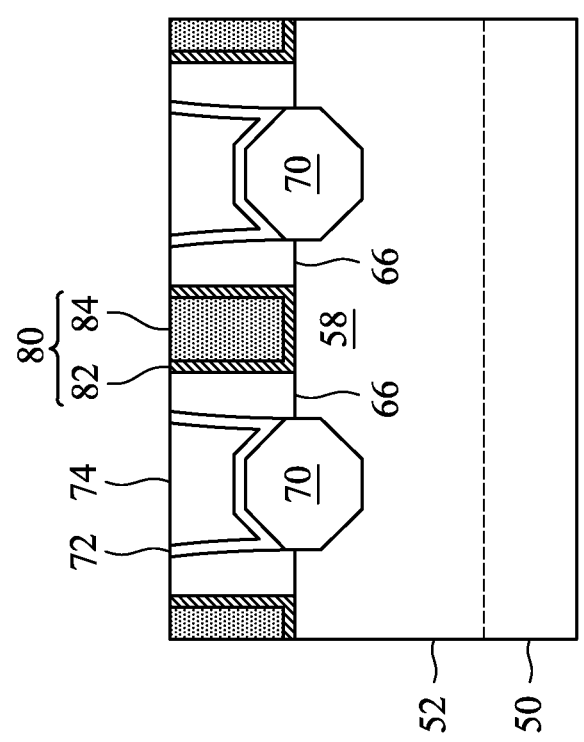

In FIGS. 5A and 5B, the dummy gates 62 are removed and are replaced with metal gates 80. The metal gates 80 include gate dielectrics 82 and gate electrodes 84. As an example to form the metal gates 80, the dummy gates 62, and the masks 64 if present, are removed in one or more etching step(s), so that recesses are formed. Portions of the dummy gate dielectrics 60 in the recesses may also be removed. In some embodiments, only the dummy gates 62 are removed and the dummy gate dielectrics 60 remain and are exposed by the recesses. In some embodiments, the dummy gate dielectrics 60 are removed from recesses in a first region of a die (e.g., a core logic region) and remain in recesses in a second region of the die (e.g., an input/output region). In some embodiments, the dummy gates 62 are removed by an anisotropic dry etch process. For example, the etching process may include a dry etch process using reaction gas(es) that selectively etch the dummy gates 62 without etching the first ILD layer 74 or the gate spacers 66. The recesses expose the fins 52. Specifically, the channel regions 58 are exposed by the recesses. Each channel region 58 is disposed between neighboring pairs of the epitaxial source/drain regions 70. During the removal, the dummy gate dielectrics 60 may be used as etch stop layers when the dummy gates 62 are etched. The dummy gate dielectrics 60 may then be optionally removed after the removal of the dummy gates 62. After the removal, the gate dielectrics 82 are deposited conformally in the recesses, such as on the top surfaces and the sidewalls of the fins 52 and on sidewalls of the gate spacers 66. The gate dielectrics 82 may also be formed on top surface of the first ILD layer 74. In accordance with some embodiments, the gate dielectrics 82 comprise silicon oxide, silicon nitride, or multilayers thereof. In some embodiments, the gate dielectrics 82 include a high-k dielectric material, and in these embodiments, the gate dielectrics 82 may have a k value greater than about 7.0, and may include a metal oxide or a silicate of Hf, Al, Zr, La, Mg, Ba, Ti, Pb, and combinations thereof. The formation methods of the gate dielectrics 82 may include Molecular-Beam Deposition (MBD), atomic layer deposition (ALD), PECVD, and the like. In embodiments where portions of the dummy gate dielectrics 60 remain in the recesses, the gate dielectrics 82 include a material of the dummy gate dielectrics 60 (e.g., $SiO_2$). The gate electrodes 84 are deposited over the gate dielectrics 82, respectively, and fill the remaining portions of the recesses. The gate electrodes 84 may include a metal-containing material such as TiN, TiO, TaN, TaC, Co, Ru, Al, W, combinations thereof, or multi-layers thereof. For example, although a single-layered gate electrode 84 is illustrated, each gate electrode 84 may comprise any number of liner layers, any number of work function tuning layers, and a fill material. After the filling of the gate electrodes 84, a planarization process, such as a CMP, may be performed to remove the excess portions of the gate dielectrics 82 and the material of the gate electrodes 84, which excess portions are over the top surface of the first ILD layer 74. The remaining portions of material of the gate electrodes 84 and the gate dielectrics 82 thus form replacement gates of the resulting FinFETs. The metal gates 80 may be also referred to as "gate stacks" or "replacement gate stacks." The metal gates 80 may extend along sidewalls of a channel region 58 of the fins 52.

The formation of the gate dielectrics 82 in the region 50N and the region 50P may occur simultaneously such that the gate dielectrics 82 in each region are formed from the same materials, and the formation of the gate electrodes 84 may occur simultaneously such that the gate electrodes 84 in each region are formed from the same materials. In some embodiments, the gate dielectrics 82 in each region may be formed by distinct processes, such that the gate dielectrics 82 may be different materials, and/or the gate electrodes 84 in each region may be formed by distinct processes, such that the gate electrodes 84 may be different materials. Various masking steps may be used to mask and expose appropriate regions when using distinct processes.

FIGS. 6A through 10B are various views of further intermediate stages in the manufacturing of FinFETs, in accordance with some embodiments. FIGS. 6A, 7A, 8A, 9A, and 10A are cross-sectional views illustrated along reference cross-section A-A in FIG. 1. FIGS. 6B, 7B, 8B, 9B, and 10B are top-down views.

FIGS. 6A through 10B show an embodiment where epitaxial source/drain regions 70 are not formed adjacent to all of the metal gates 80. Some of the metal gates 80 can be adjacent to one or no epitaxial source/drain regions 70. For example, FIG. 6B illustrates metal gates 80A that are adjacent to pairs of epitaxial source/drain regions 70 and over respective channel regions 58, and also illustrates metal gates 80B that are adjacent to only one epitaxial source/drain region 70 and are not formed over respective channel regions.

Further, FIGS. 6A through 10B show an embodiment where a transistor is formed from multiple fins, e.g., a fin group 52G (see FIG. 2C). Thus, contacts to the epitaxial source/drain regions 70 (discussed further below) will extend over respective fin groups 52G. It should be appreciated that similar techniques as those discussed below may be used for embodiments where a transistor is formed from a single fin 52S (see FIG. 2D).

Figure 6A:
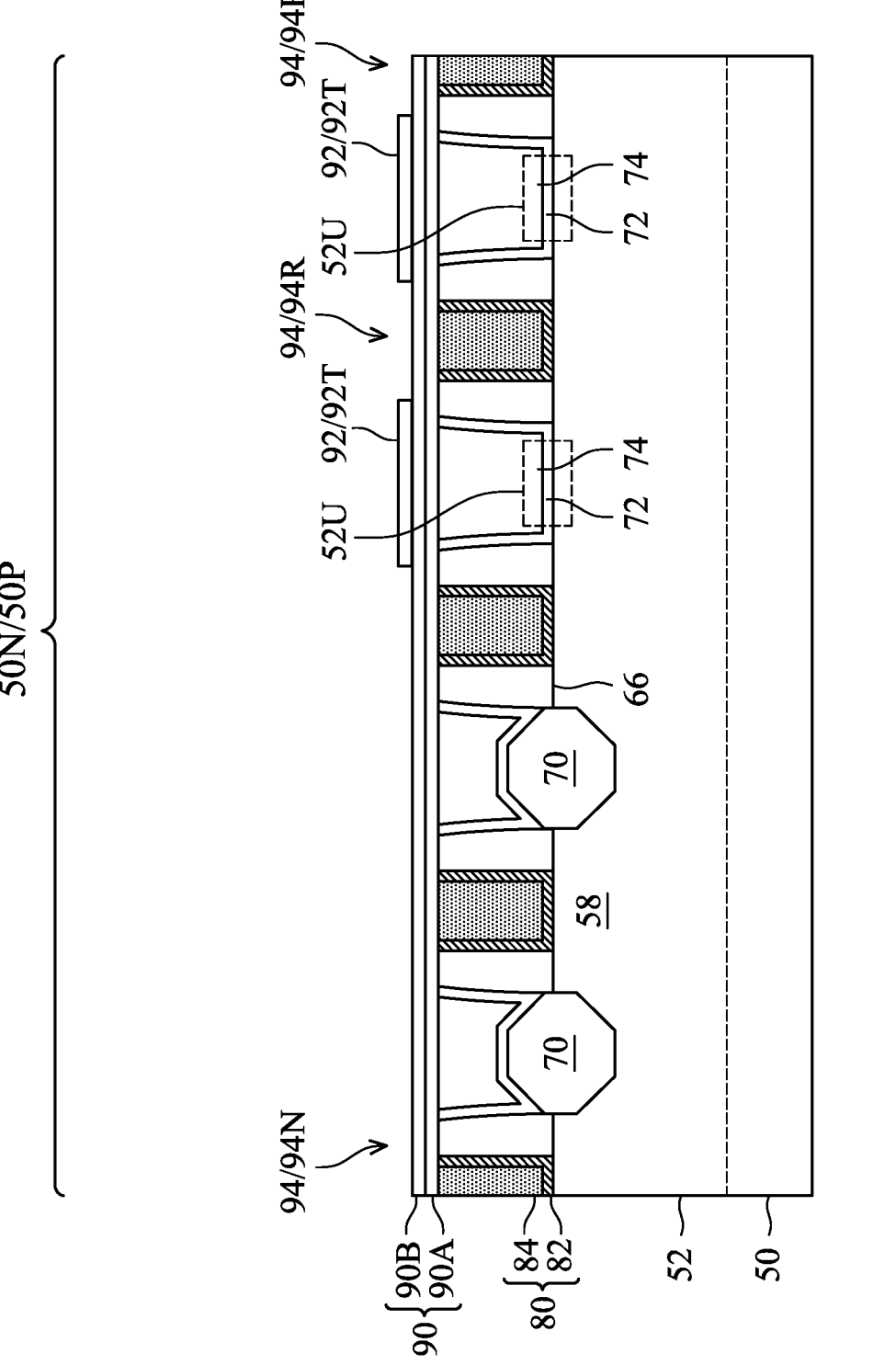
FIGS. 6A through 10B are various views of further intermediate stages in the manufacturing of FinFETs, in accordance with some embodiments.
Figure 6B:
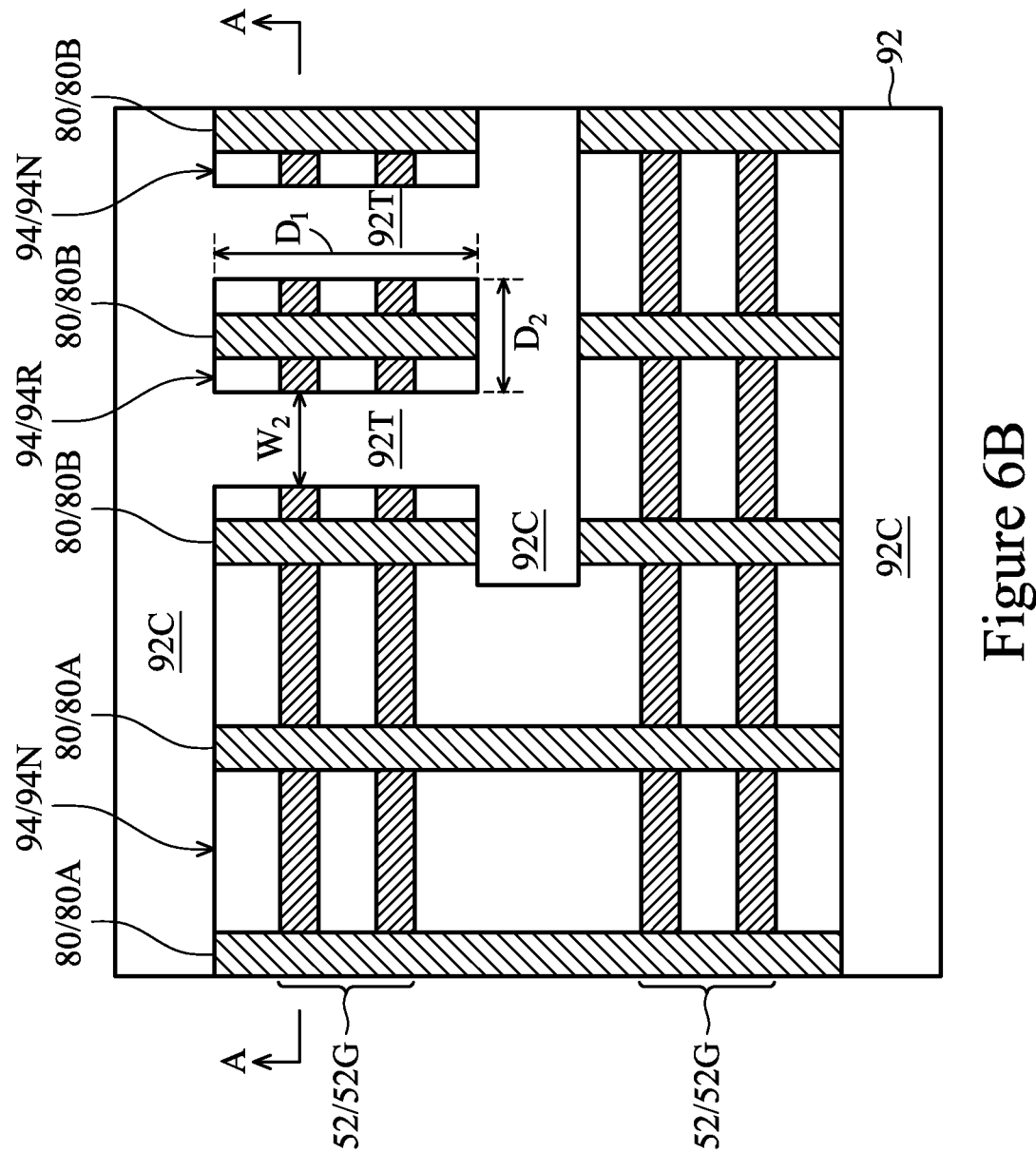

In FIG. 6A, one or more masking layer(s) 90 are formed over the metal gates 80 and first ILD layer 74. FIG. 6B is a top-down view, where FIG. 6A is illustrated along reference cross-section A-A in FIG. 6B, but where some features are omitted for clarity of illustration. In the embodiment shown, the masking layer(s) 90 are a multilayer structure comprising a lower masking layer 90A and an upper masking layer 90B on the lower masking layer 90A. In some embodiments, a single masking layer 90 is used. A cut mask 92 is then formed over the masking layer(s) 90. The cut mask 92 has cut openings 94 exposing the masking layer(s) 90, such as the upper masking layer 90B in embodiments where the masking layer(s) 90 comprise a multilayer.

The lower masking layer 90A is formed over the metal gates 80 and first ILD 74. The lower masking layer 90A may be formed of a material that includes a metal (e.g., titanium nitride, titanium, tantalum nitride, tantalum, a metal-doped carbide (e.g., tungsten carbide), or the like) and/or a metalloid (e.g., silicon nitride, boron nitride, silicon carbide, or the like). In some embodiments, a material composition of the lower masking layer 90A is determined to provide a high etch selectivity with respect to other layers, such as the first ILD layer 74, and/or to subsequently formed layers, such as the upper masking layer 90B (described in greater detail below). The lower masking layer 90A may be formed by a process such as chemical vapor deposition (CVD), ALD, or the like. Other processes and materials may be used. In some embodiments, the lower masking layer 90A has a thickness in the range of about 15 nm to about 20 nm, although in other embodiments the lower masking layer 90A may have another thickness. In subsequent processing steps, a pattern is formed in the lower masking layer 90A using patterning techniques described herein. The lower masking layer 90A is then used as an etching mask for etching the first ILD layer 74, in which the pattern of the lower masking layer 90A is transferred to the first ILD layer 74.

The upper masking layer 90B is formed on the lower masking layer 90A. In subsequent processing steps, a pattern is formed in the upper masking layer 90B using patterning techniques described herein. The patterned upper masking layer 90B is then used as an etching mask for patterning the lower masking layer 90A. The upper masking layer 90B may be formed from a silicon oxide, such as borophosphosilicate tetraethylorthosilicate (BPTEOS) or undoped tetraethylorthosilicate (TEOS) oxide, and may be formed by CVD, ALD, plasma-enhanced atomic layer deposition (PEALD), spin-on coating, or the like. The upper masking layer 90B may include a Low-Temperature (LT) oxide layer, which is deposited at a low temperature, for example, lower than about 100° C. In some embodiments, a material composition of the upper masking layer 90B may be determined to provide a high etch selectivity with respect to other layers such as the lower masking layer 90A. The upper masking layer 90B may include more than one layer and may be formed of more than one material. In some embodiments, the upper masking layer 90B has a thickness in the range of about 38 nm to about 40 nm, although in other embodiments the upper masking layer 90B may have another thickness. In subsequent processing steps, a pattern is formed in the upper masking layer 90B using patterning techniques described herein.

The cut mask 92 is formed of a dielectric material that has a high etch selectivity with respect to the masking layer(s) 90, relative the etching process that will be used to pattern the cut openings 94. For example, the cut mask 92 can comprise an inorganic material, such as a nitride (such as silicon nitride), an oxynitride (such as silicon oxynitride), an oxide (such as silicon oxide), or the like, and can be formed by a process such as CVD, ALD, spin-on coating, or the like. In some embodiments, the cut mask 92 is formed of silicon nitride. As an example of forming the cut mask 92, a layer of dielectric material can be deposited to a thickness in the range of about 30 nm to about 35 nm. The layer of dielectric material can then be patterned with cut openings 94 exposing the masking layer(s) 90. The cut openings 94 can be patterned by acceptable photolithography and etching processes. For example an anisotropic wet etch can be performed using a photoresist as an etching mask to pattern the cut openings 94.

The cut mask 92 has cut portions 92C and trim portions 92T. The cut portions 92C are strips, and may have substantially uniform widths in the top view. Furthermore, the cut portions 92C run perpendicular to and overlap the metal gates 80, but run parallel to and do not overlap the fins 52. Each cut portion 92C is laterally disposed between one or more fins 52, such as directly over features that are disposed between the one or more fins 52. Each cut portion 92C is laterally disposed between respective fin groups 52G (or respective fins 52S, see FIG. 2D). In other words, a fin group 52G (or fin 52S, see FIG. 2D) is laterally disposed between a neighboring pair of the cut portions 92C. As discussed further below, the cut portions 92C define where cuts are located between subsequently formed contacts. The trim portions 92T are perpendicular to the cut portions 92C, e.g., the trim portions 92T run perpendicular to and overlap the fins 52, but run parallel to and do not overlap the metal gates 80. Each trim portion 92T is laterally disposed between two metal gates 80, such as directly over features that are disposed between two metal gates 80. Each trim portion 92T extends over a fin group 52G (or a respective fin 52S, see FIG. 2D), and connects the cut portions 92C that extend along the respective fin group 52G (or the respective fin 52S, see FIG. 2D). As discussed further below, the trim portions 92T define where contacts will not be subsequently formed.

As shown in FIG. 6A, some unused regions 52U of the fins 52 (also called dummy regions) do not contain epitaxial source/drain regions 70, and some regions of the fins 52 do not contain channel regions 58. The unused regions 52U of the fins 52 can be disposed between the metal gates 80B (see FIG. 6B), e.g., between metal gates 80 that are not disposed between respective neighboring pairs of the epitaxial source/drain regions 70. The CESL 72 directly contacts and extends along the top surfaces of the unused regions 52U of the fins 52. Specifically, pairs of the gate spacers 66 can expose unused regions 52U of the fins 52, with the CESL 72 extending continually over portions of the fins 52 between the pair of gate spacers 66 and along sidewalls of the gate spacers 66. In accordance with some embodiments, the trim portions 92T are formed over the unused regions 52U of each of the fins 52. As noted above, the trim portions 92T define where contacts will not be subsequently formed. Because there are no epitaxial source/drain regions 70 in the unused regions 52U of the fins 52, any contacts formed to the unused regions 52U of the fins 52 would be electrically isolated and remain unused, e.g., would be dummy contacts. Such dummy contacts would induce a parasitic capacitance on adjacent metal gates 80. By forming the trim portions 92T over the unused regions 52U of the fins 52, the formation of undesirable dummy contacts to the unused regions 52U of the fins 52 may be avoided. Specifically, all dielectric features (e.g., the gate spacers 66, CESL 72, and first ILD layer 74) that are over the unused regions 52U of the fins 52 and between the metal gates 80B (see FIG. 6B) are free of conductive features.

As shown in FIG. 6B, the cut openings 94 are defined by the cut portions 92C and trim portions 92T. Some cut openings 94 are defined by two cut portions 92C and two trim portions 92T. Specifically, at least some of the cut openings 94R can have regular shapes in the top-down view, e.g., quadrilateral shapes, where the cut openings 94R are defined by four straight segments of the dielectric material of the cut mask 92. Conversely, other cut openings 94N have irregular shapes in the top-down view, and are defined by more than four straight segments of the dielectric material of the cut mask 92. For example, the cut openings 94N can be defined by more than two cut portions 92C and more than two trim portions 92T.

The cut openings 94 can have various shapes and sizes, depending on the positions and lengths of the cut portions 92C and trim portions 92T. However, the minimum dimensions of the cut openings 94R can be constrained based on the limits of a photography process that will be used to pattern subsequently formed contacts, and based on the width $W_1$ and pitch $P_1$ of the fins 52 (see FIG. 2B). Further, adjacent trim portions 92T can be formed close together. Continuing the example from above, the distance between cut portions 92C can be constrained to a minimum distance $D_1$, which can be in the range of about 30 nm to about 42 nm, and the minimum distance between trim portions 92T can also be constrained to a minimum distance $D_2$, which can be in the range of about 50 nm to about 100 nm. In this embodiment, the distance $D_2$ can be less than the distance $D_1$. Further, the trim portions 92T are formed to a width $W_2$, which is measured along a direction parallel to the longitudinal axes of the fins 52. The width $W_2$ can be in the range of about 30 nm to about 40 nm. Constraining the dimensions of the openings 94R allows the first ILD layer 74 to be patterned without under-etching, particularly when multiple masks (e.g., the cut mask 92 and the line mask 96) are used to pattern the first ILD layer 74.

Figure 7A:
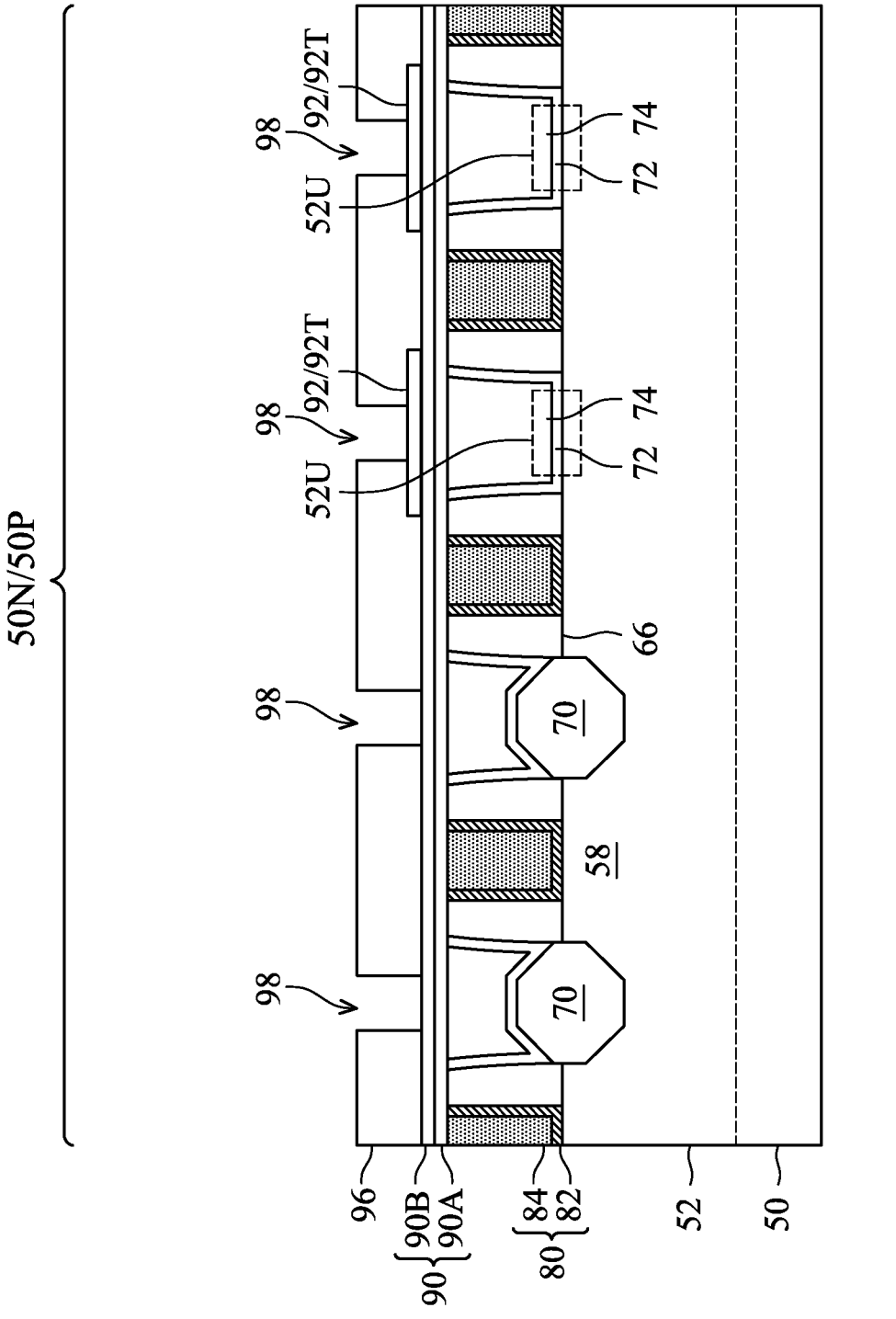
Figure 7B:
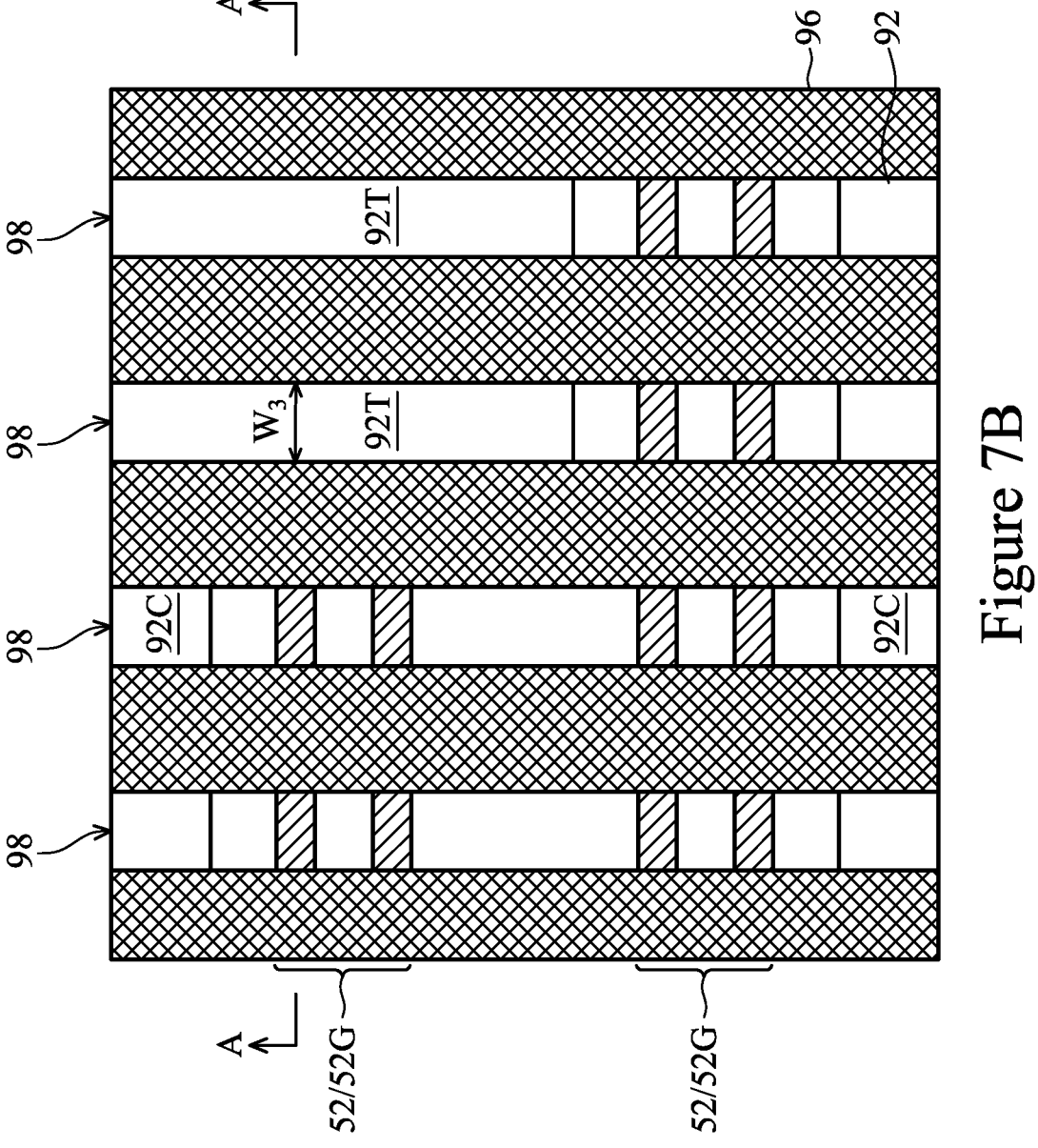

In FIG. 7A, a line mask 96 is formed on the cut mask 92 and on the portions of the masking layer(s) 90 exposed by the cut openings 94. FIG. 7B is a top-down view, where FIG. 7A is illustrated along reference cross-section A-A in FIG. 7B, but where some features are omitted for clarity of illustration. The line mask 96 has slot openings 98 exposing the underlying cut mask 92 and masking layer(s) 90. The slot openings 98 in the line mask 96 define regions in which contacts will be formed in the first ILD layer 74 and coupled to the epitaxial source/drain regions 70 of the resulting FinFETs. As discussed further below, the cut openings 94 in the cut mask 92 define where cuts are located between the contacts subsequently formed in the first ILD layer 74. Some portions of the line mask 96 are formed in the openings 94R (see FIG. 6B).

The line mask 96 can be formed of a photoresist, such as a single layer photoresist, a bi-layer photoresist, a tri-layer photoresist, or the like. In some embodiments, the line mask 96 is a tri-layer mask comprising a bottom layer (e.g., a bottom anti-reflective coating (BARC) layer), a middle layer (e.g., a nitride, an oxide, an oxynitride, or the like), and a top layer (e.g., a photoresist). The type of mask used (e.g., single layer mask, bilayer mask, tri-layer mask, etc.) may depend on the photolithography process used to pattern the line mask 96. For example, in extreme ultraviolet (EUV) lithography processes, the line mask 96 may be a single layer mask or a bilayer mask. The line mask 96 can be patterned using acceptable photolithography techniques to form the slot openings 98. The slot openings 98 are strips, and may have substantially uniform widths in the top view. Furthermore, the slot openings 98 run perpendicular to and overlap the fins 52, but run parallel to and do not overlap the metal gates 80. The slot openings 98 also overlap the first ILD layer 74 and cut mask 92. The overlap regions between the slot openings 98 and cut mask 92 correspond to the cuts that will be located between the contacts subsequently formed in the first ILD layer 74.

The slot openings 98 are formed to a width $W_3$, which is measured along a direction parallel to the longitudinal axes of the fins 52. The width $W_3$ can be in the range of about 13 nm to about 15 nm. Notably, the width $W_3$ of the slot openings 98 is less than the width $W_2$ of the trim portions 92T of the cut mask 92 (see FIG. 6B). By constraining the width $W_3$ to be less than the width $W_2$, the unused regions 52U of the fins 52 can remain fully protected during subsequent patterning so that the formation of undesirable dummy contacts to the unused regions 52U of the fins 52 may be avoided.

Figure 8A:
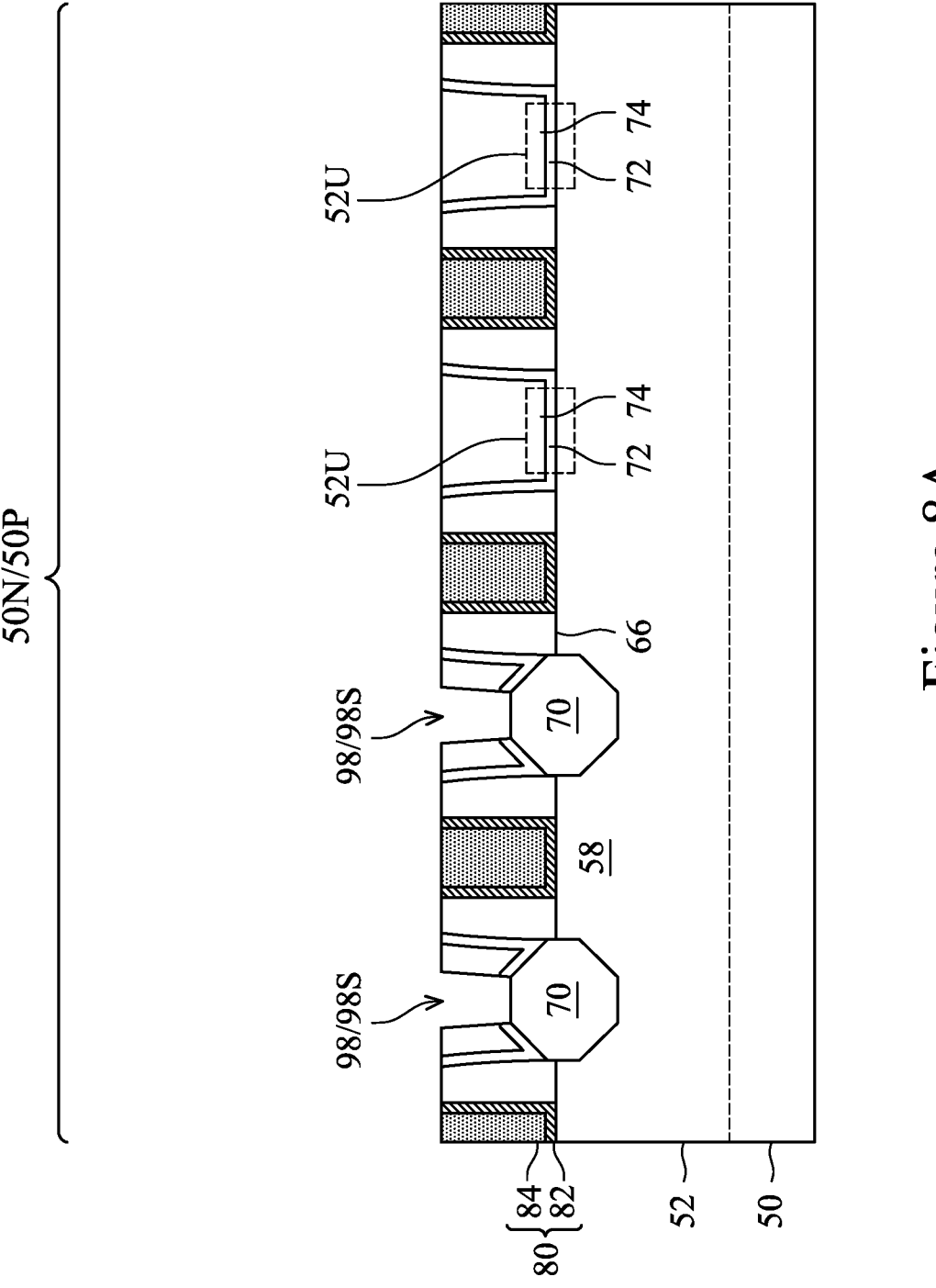
Figure 8B:
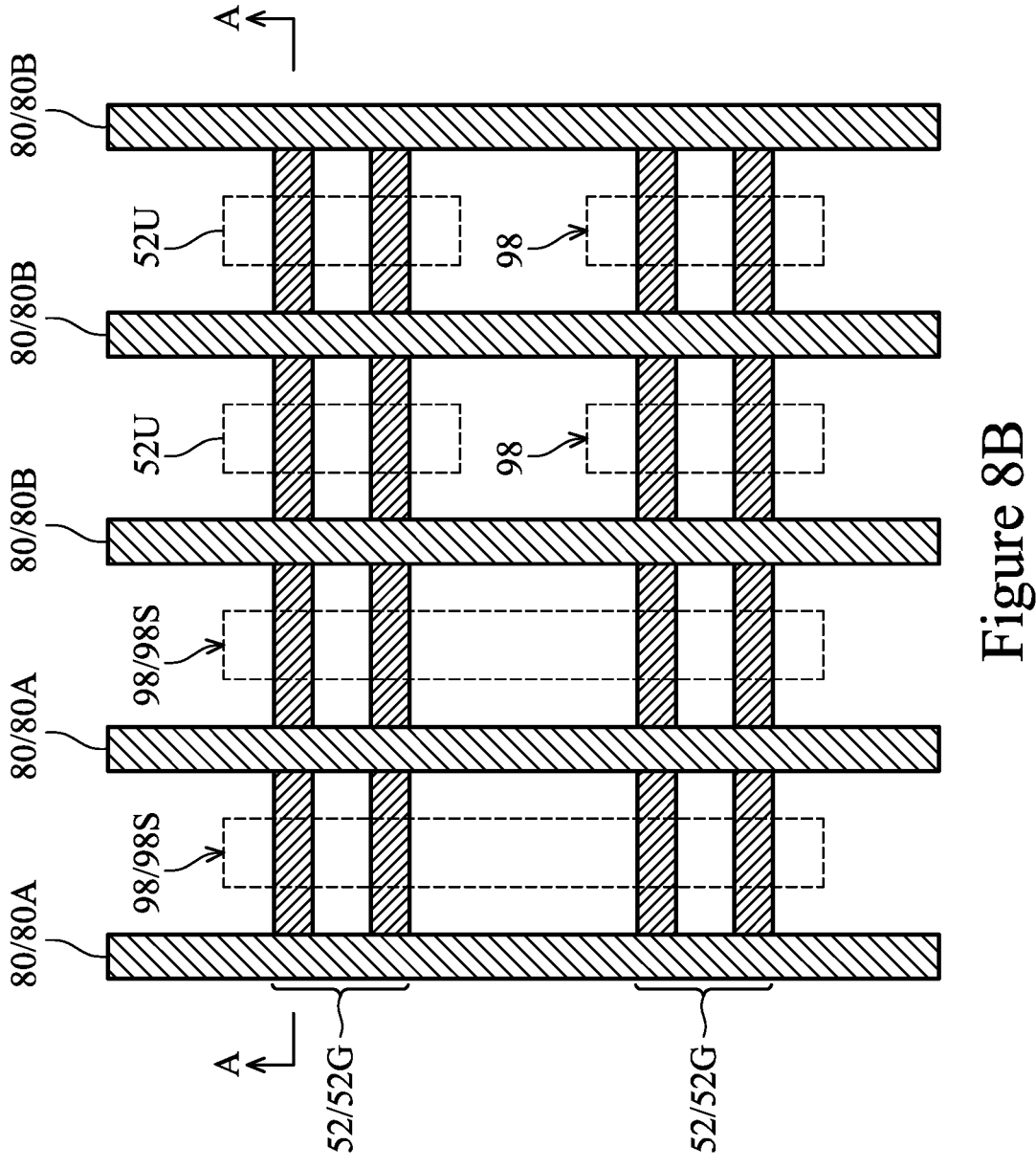

In FIG. 8A, the masking layer(s) 90 are etched using the line mask 96 and cut mask 92 (see FIG. 7A) as a combined etching mask to extend the slot openings 98 through the masking layer(s) 90. FIG. 8B is a top-down view, where FIG. 8A is illustrated along reference cross-section A-A in FIG. 8B, but where some features are omitted for clarity of illustration. During the etching, the cut mask 92 acts as an etch stop layer to prevent the slot openings 98 from extending into the portions of the masking layer(s) 90 directly underlying the cut mask 92. In other words, the portions of the first ILD layer 74 uncovered by the line mask 96 and cut mask 92 (and thus exposed by the slot openings 98 and cut openings 94) are etched. The etching may be anisotropic, so that the slot openings 98 are extended through the masking layer(s) 90 and have about the same sizes in the masking layer(s) 90 as they do in the line mask 96. The etching can comprise one or more etch process(es) that attack the masking layer(s) 90, but do not attack the cut mask 92. For example, when the masking layer(s) 90 comprise a multi-layer, a first etching process may be performed to pattern the upper masking layer 90B, and a second etching process may be performed to pattern the lower masking layer 90A.

The first etching process may include a dry etching process having a high etching selectivity of the upper masking layer 90B relative to the lower masking layer 90A and cut mask 92. In some embodiments, the dry etching process may include an inductively-coupled plasma generated with a power in the range of about 150 Watts to about 1500 Watts and may be performed at a pressure in the range of about 3 mTorr to about 80 mTorr. In some embodiments, the dry etching process may use a fluorine-based etchant gas such as $CF_4$, $CH_2F_2$, $CHF_3$, or another type of process gas. Other etching techniques may be used in other embodiments. During the etching of the upper masking layer 90B, the line mask 96 may be at least partially consumed. In embodiments when the line mask 96 is not completely consumed while etching the upper masking layer 90B, a suitable removal process (e.g., an ashing or stripping process) may be performed to remove remaining residue of the line mask 96.

The second etching process may include a wet etching process having a high etching selectivity of the lower masking layer 90A relative to the upper masking layer 90B, first ILD layer 74, and cut mask 92. In some embodiments, the wet etching process may use an etchant such as dilute hydrofluoric acid (dilute HF), de-ionized water (DIW), SC-1 (e.g., a combination of DIW, ammonia water, and aqueous $H_2O_2$) or the like, and may be performed at a temperature in the range of about 50° C. to about 70° C. Other etching techniques may be used in other embodiments. After the second etching process, portions of the first ILD layer 74 are exposed. Any remaining portions of the cut mask 92 can then be removed, such as by a wet clean process.

Using two masks (e.g., the line mask 96 and cut mask 92) to pattern the slot openings 98 in the masking layer(s) 90 allows uniformity of the pattern in the masking layer(s) 90 to be maintained. Specifically, forming the line mask 96 with slot openings 98 allows a uniform distance between the slot openings 98 to be maintained, and forming the cut mask 92 with cut portions 92C allows a uniform distance between cuts to be maintained.

The first ILD layer 74 is then etched using the patterned masking layer(s) 90 as an etching mask to extend the slot openings 98 through the first ILD layer 74 and the CESL 72. The slot openings 98 may be extended using acceptable etching techniques. For example, the slot openings 98 can be extended through the first ILD layer 74 using a first etching process, and the CESL 72 can then be opened using a second etching process. The masking layer(s) 90 may be consumed during the etching, or may be removed after the etching. Removal may be by, e.g., a wet clean process, a CMP process, or the like.

The slot openings 98 expose the epitaxial source/drain regions 70 and portions of the STI regions 56. As noted above, the trim portions 92T of the cut mask 92 (see FIG. 6B) define where slot openings 98 will not be formed, with the trim portions 92T being formed over the unused regions 52U of the fins 52. As a result, each of the slot openings 98 exposes at least one epitaxial source/drain region 70. In other words, as shown in FIG. 8B, none of the slot openings 98 expose the unused regions 52U of the fins 52. Further, a subset of the slot openings 98S expose multiple epitaxial source/drain regions 70, and define regions in which shared contacts will be formed for the exposed epitaxial source/drain regions 70. Advantageously, by avoiding the formation of slot openings 98 to the unused regions 52U of the fins 52, the formation of undesirable dummy contacts may be avoided.

Figure 9A:
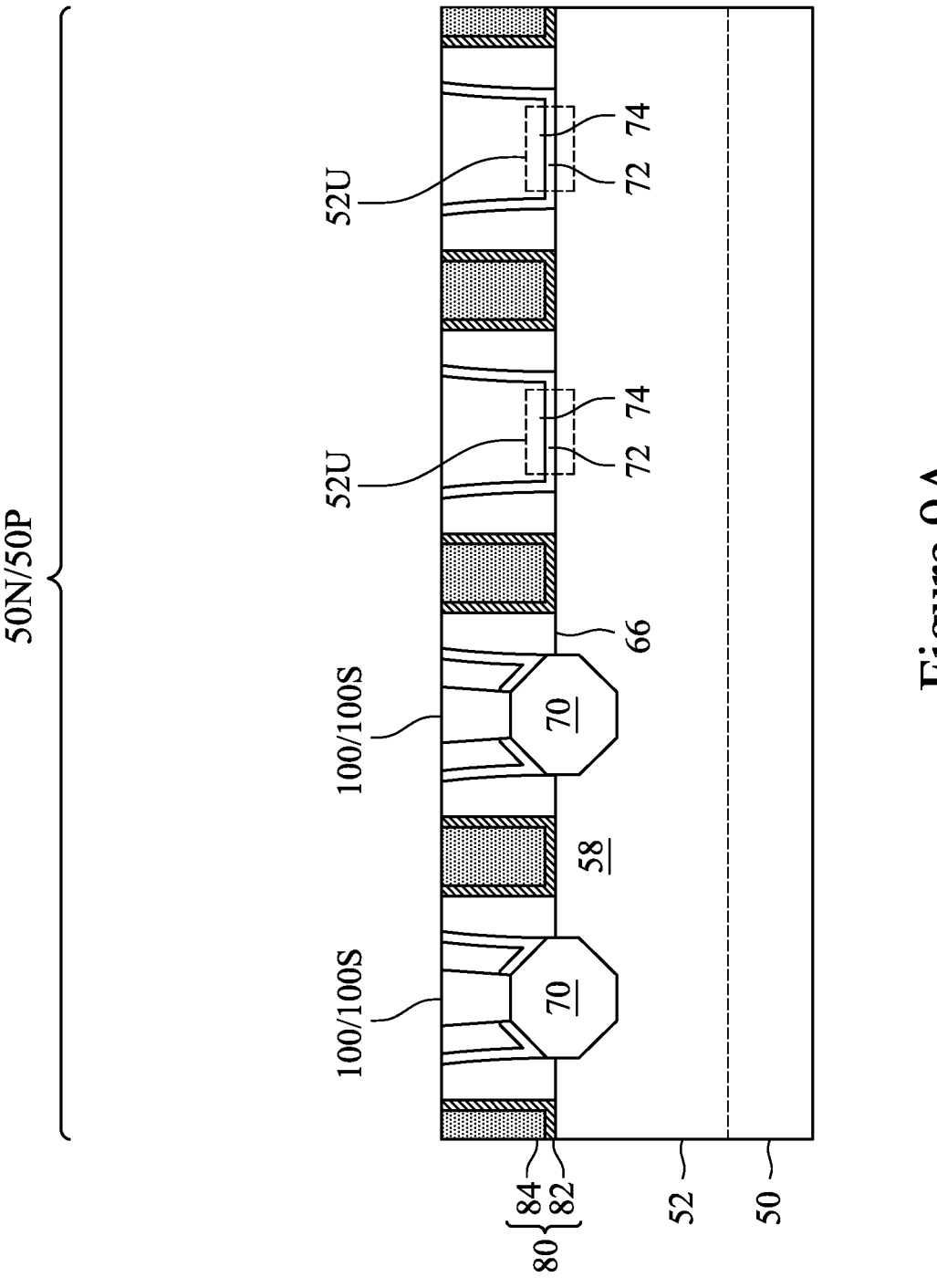
Figure 9B:
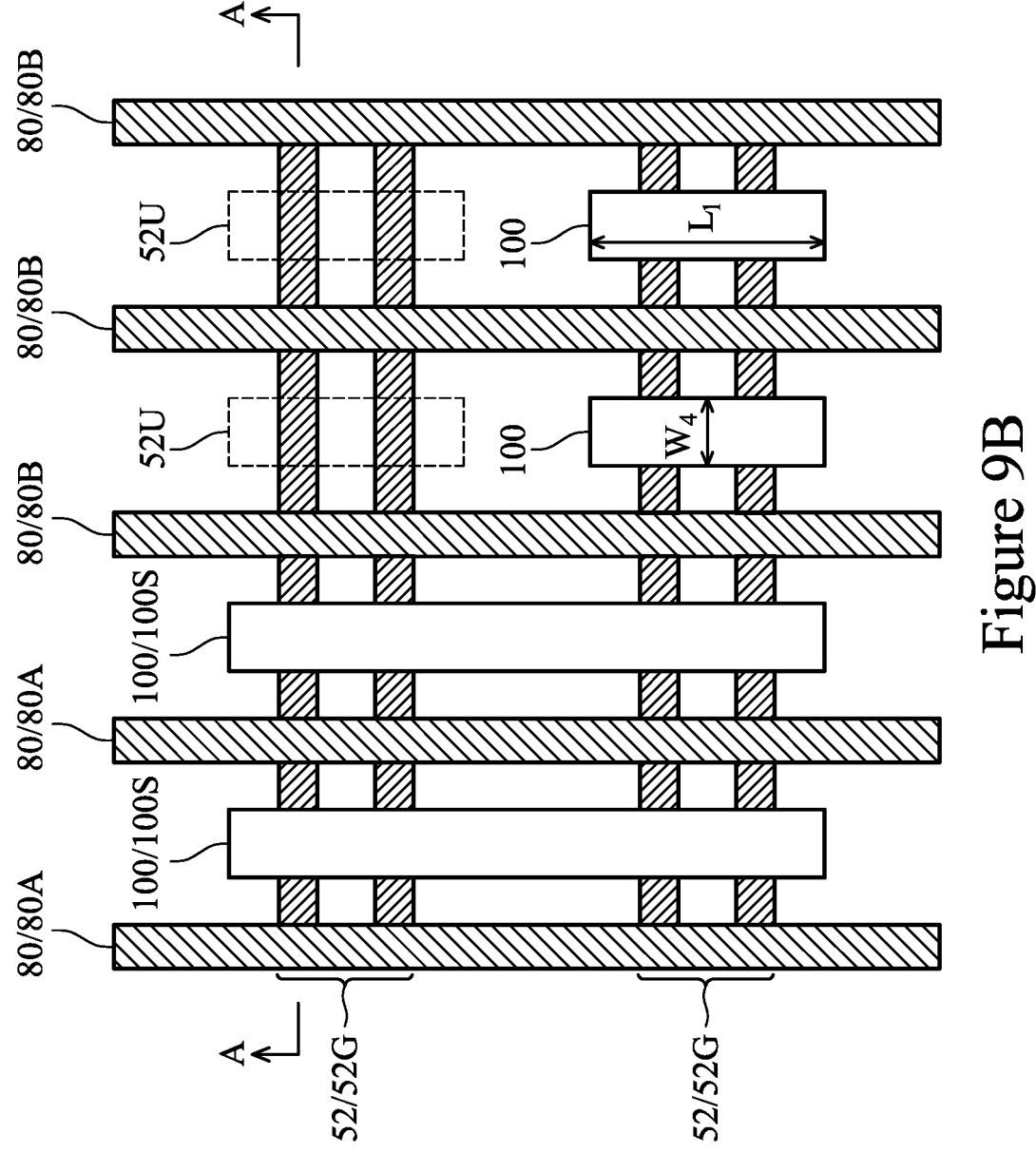

In FIG. 9A, lower source/drain contacts 100 are formed in the slot openings 98 (see FIGS. 8A and 8B). FIG. 9B is a top-down view, where FIG. 9A is illustrated along reference cross-section A-A in FIG. 9B, but where some features are omitted for clarity of illustration. A liner, such as a diffusion barrier layer, an adhesion layer, or the like, and a conductive material are formed in the slot openings 98. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the first ILD layer 74. The remaining liner and conductive material form the lower source/drain contacts 100 in the slot openings 98. An anneal process may be performed to form a silicide at the interface between the epitaxial source/drain regions 70 and the lower source/drain contacts 100. The lower source/drain contacts 100 are physically and electrically coupled to the epitaxial source/drain regions 70.

As noted above, the trim portions 92T of the cut mask 92 (see FIG. 6B) define where contacts will not be formed, with the trim portions 92T being formed over the unused regions 52U of the fins 52. As a result, each of the lower source/drain contacts 100 is coupled to at least one epitaxial source/drain region 70. In other words, none of the lower source/drain contacts 100 are coupled to the unused regions 52U of the fins 52. Rather, all of the unused regions 52U of the fins 52 are contacted by the CESL 72 (see FIG. 9A). Further, a subset of the lower source/drain contacts 100S are formed in the slot openings 98S, and are thus coupled to multiple epitaxial source/drain regions 70. The lower source/drain contacts 100S are shared contacts, which can be formed in some types of devices, such as memories, e.g., static random access memory (SRAM) cells.

As noted above, the slot openings 98 of the line mask 96 (see FIGS. 7A and 7B) define where the lower source/drain contacts 100 will be formed. As also noted above, the slot openings 98 are strips. As a result, the lower source/drain contacts 100 are also strips, and extend across respective fin groups 52G (or respective fins 52S, see FIG. 2D). Specifically, the lower source/drain contacts 100 have lengths $L_1$ along their longitudinal axes and have widths $W_4$ along their latitudinal axes. The lengths $L_1$ are greater than the widths $W_4$, and the longitudinal axes of the lower source/drain contacts 100 are perpendicular to the longitudinal axes of the fins 52 (see FIG. 9B). The longitudinal axes of the fins 52 and lower source/drain contacts 100 are parallel to a major surface of the substrate 50. Forming the lower source/drain contacts 100 with a slotted mask allows the lower source/drain contacts 100 to be formed to small dimensions. For example, the lengths $L_1$ can be in the range of about 30 nm to about 40 nm, and the widths $W_4$ can be in the range of about 15 nm to about 18 nm.

Figure 10A:
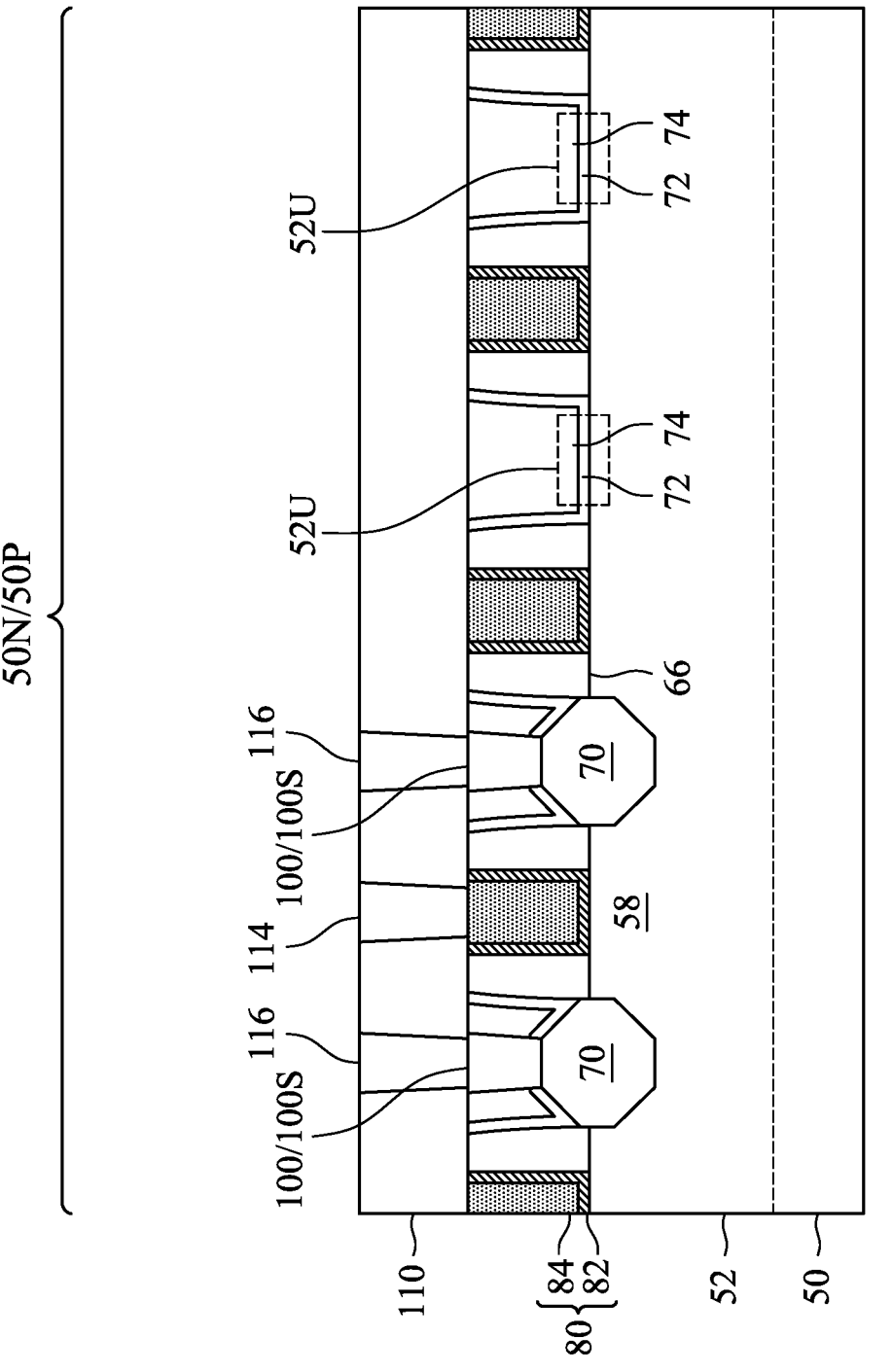
Figure 10B:
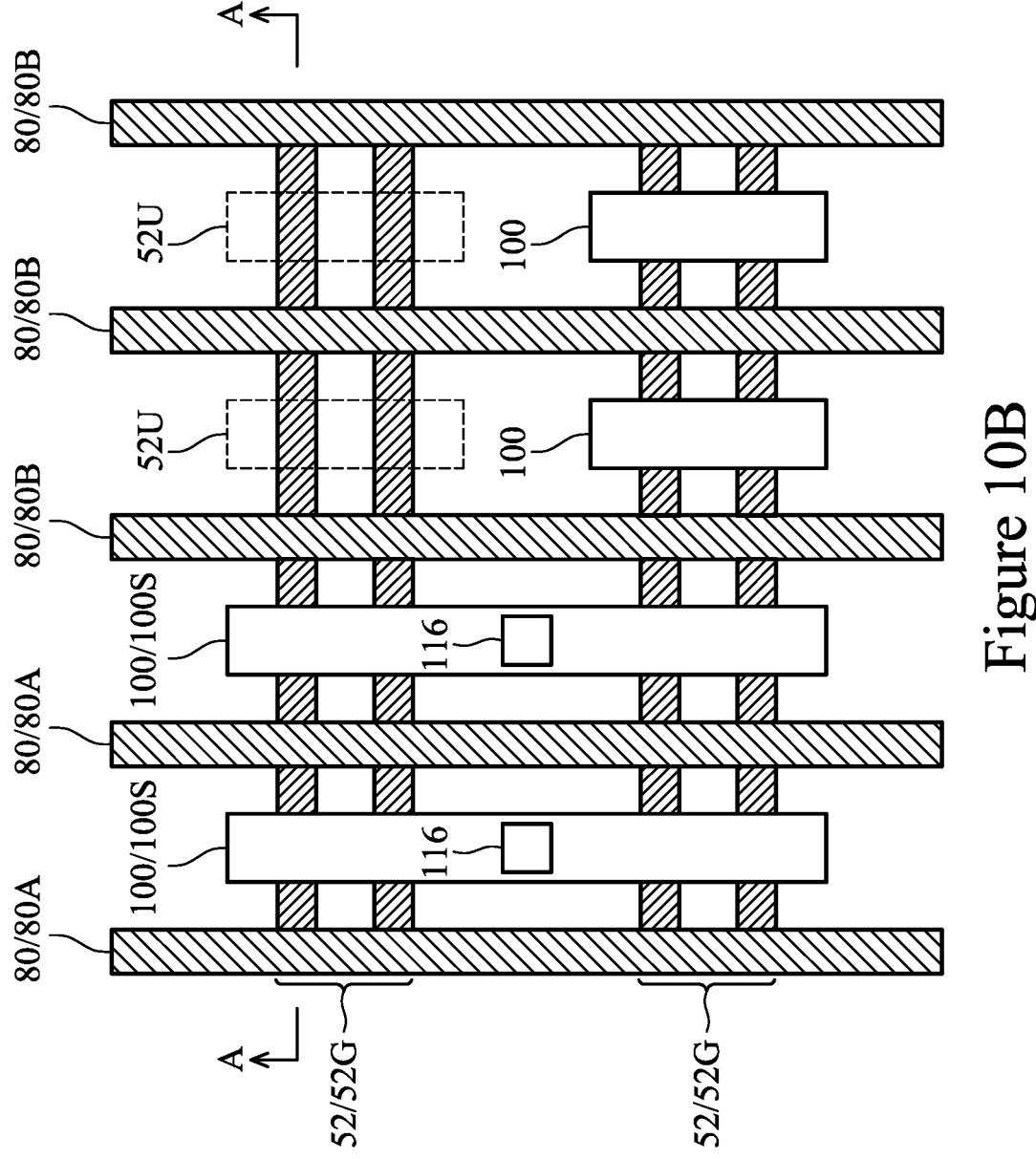

In FIG. 10A, a second ILD layer 110 is deposited over the first ILD layer 74 and lower source/drain contacts 100. FIG. 10B is a top-down view, where FIG. 10A is illustrated along reference cross-section A-A in FIG. 10B, but where some features are omitted for clarity of illustration. In some embodiments, the second ILD layer 110 is a flowable film formed by a flowable CVD method. In some embodiments, the second ILD layer 110 is formed of a dielectric material such as PSG, BSG, BPSG, USG, or the like, and may be deposited by any suitable method, such as CVD and PECVD. In accordance with some embodiments, before the formation of the second ILD layer 110, the metal gates 80 can be recessed, so that a recess is formed directly over the metal gates 80 and between opposing portions of the gate spacers 66. A gate mask (not shown) comprising one or more layers of dielectric material, such as silicon nitride, silicon oxynitride, or the like, is filled in the recess, followed by a planarization process to remove excess portions of the dielectric material extending over the first ILD layer 74.

Gate contacts 114 and upper source/drain contacts 116 are then formed through the second ILD layer 110. Openings for the gate contacts 114 and upper source/drain contacts 116 are formed through the second ILD layer 110. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 110. The remaining liner and conductive material form the upper source/drain contacts 116 and gate contacts 114 in the openings. The upper source/drain contacts 116 are physically and electrically coupled to the lower source/drain contacts 100, and the gate contacts 114 are physically and electrically coupled to the metal gates 80. The gate contacts 114 can penetrate through the gate mask, if present. The upper source/drain contacts 116 and gate contacts 114 may be formed in different processes, or may be formed in the same process. Each of the upper source/drain contacts 116 and gate contacts 114 may be formed in different cross-sections, which may avoid shorting of the contacts.

Embodiments may achieve advantages. Forming the cut mask 92 with trim portions 92T allows unused regions 52U of the fins 52 to be protected during formation of the lower source/drain contacts 100. Specifically, the trim portions 92T of the cut mask 92 act as an etch stop layer during the process for patterning the first ILD layer 74. Without the trim portions 92T, dummy contacts would be formed to the unused regions 52U of the fins 52. Although such dummy contacts would be electrically isolated and unused in a final device, such dummy contacts would induce a parasitic capacitance on adjacent metal gates 80. By avoiding the formation of dummy contacts entirely, such a parasitic capacitance may be avoided or at least reduced. The performance of the resulting FinFETs may thus be improved, particularly in some applications, such as ring oscillators, where performance can be improved by up to 1%.

Figure 11A:
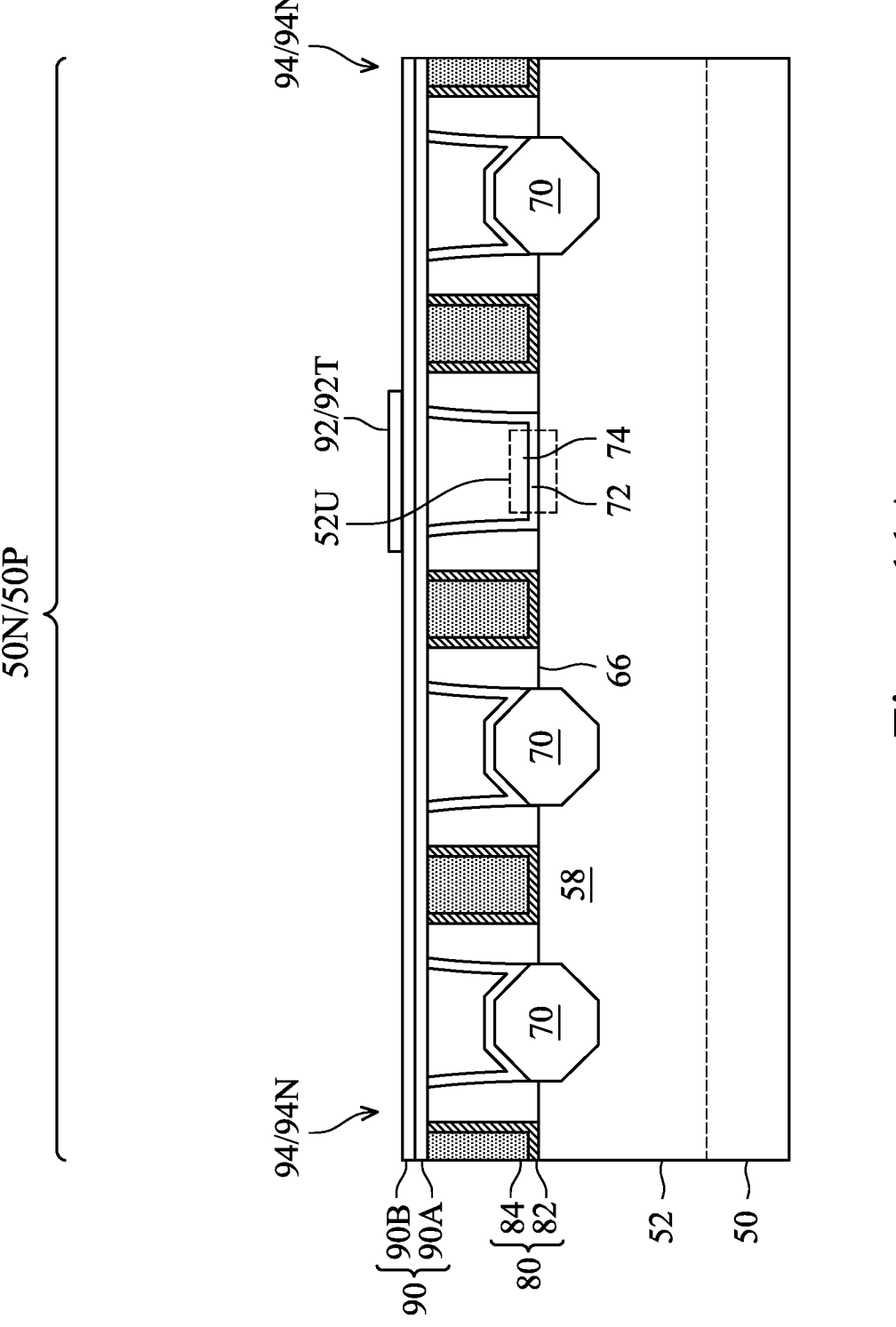
FIGS. 11A through 12B are various views of further intermediate stages in the manufacturing of FinFETs, in accordance with some other embodiments.
Figure 11B:
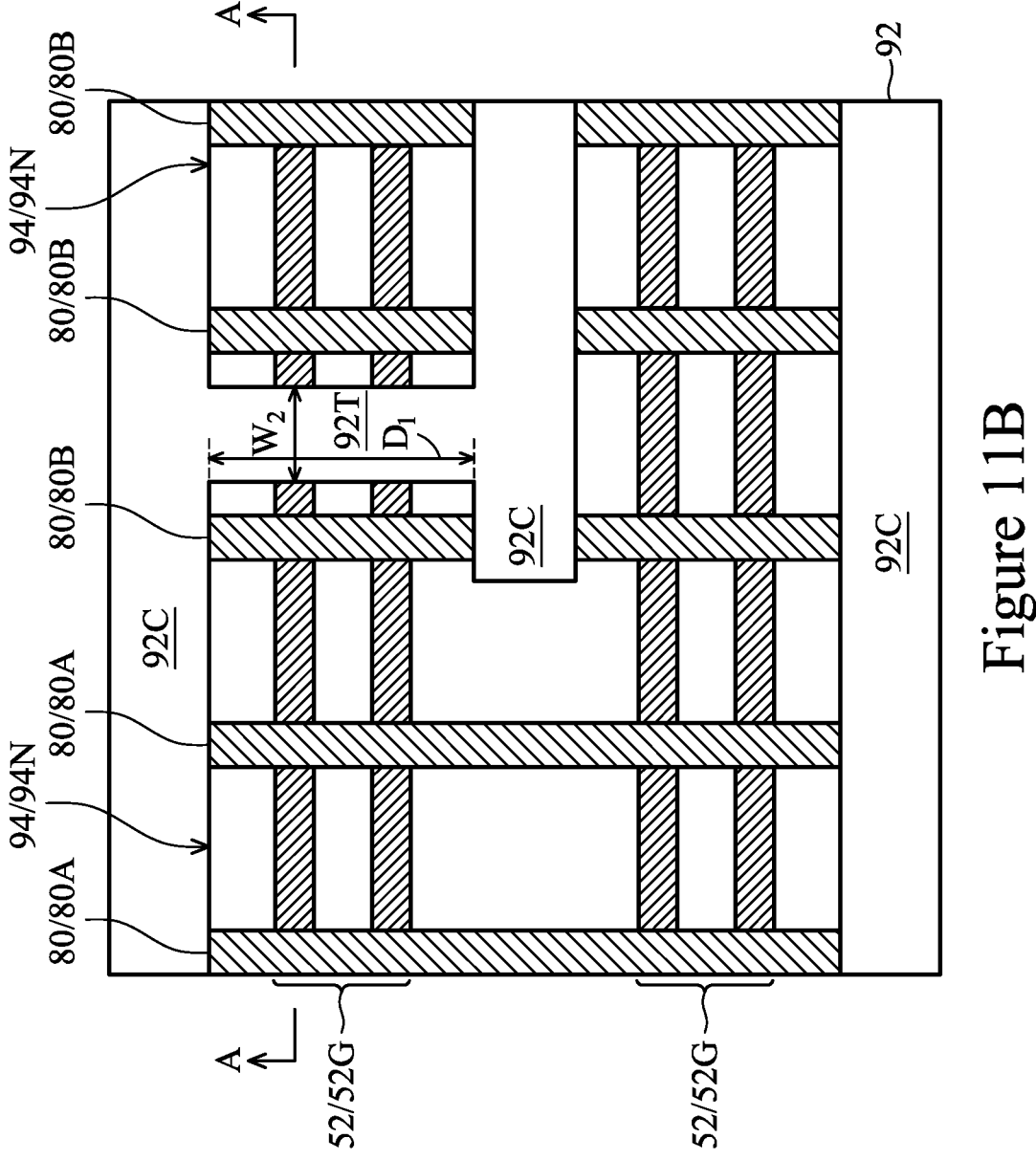
Figure 12A:
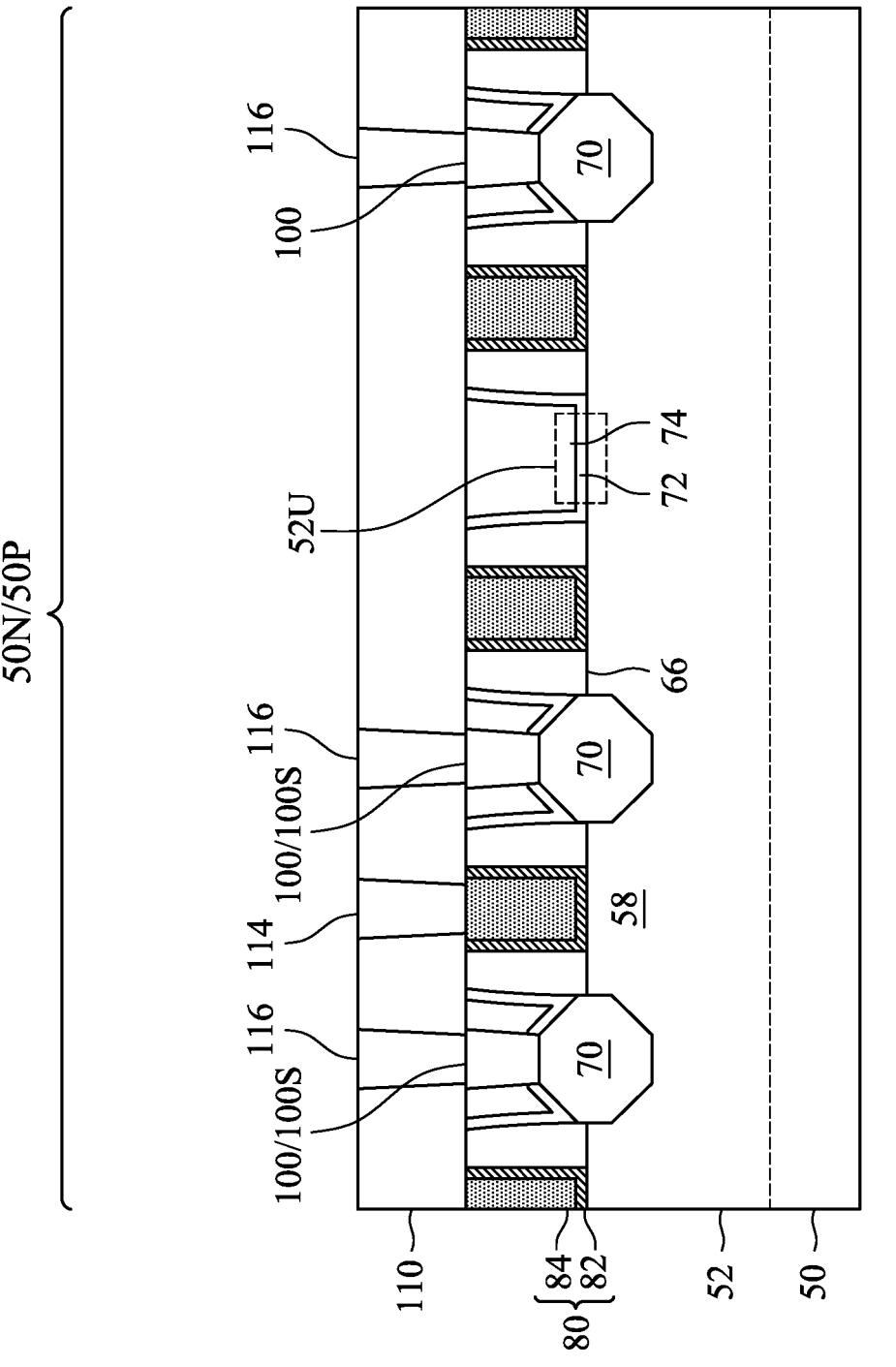
Figure 12B:
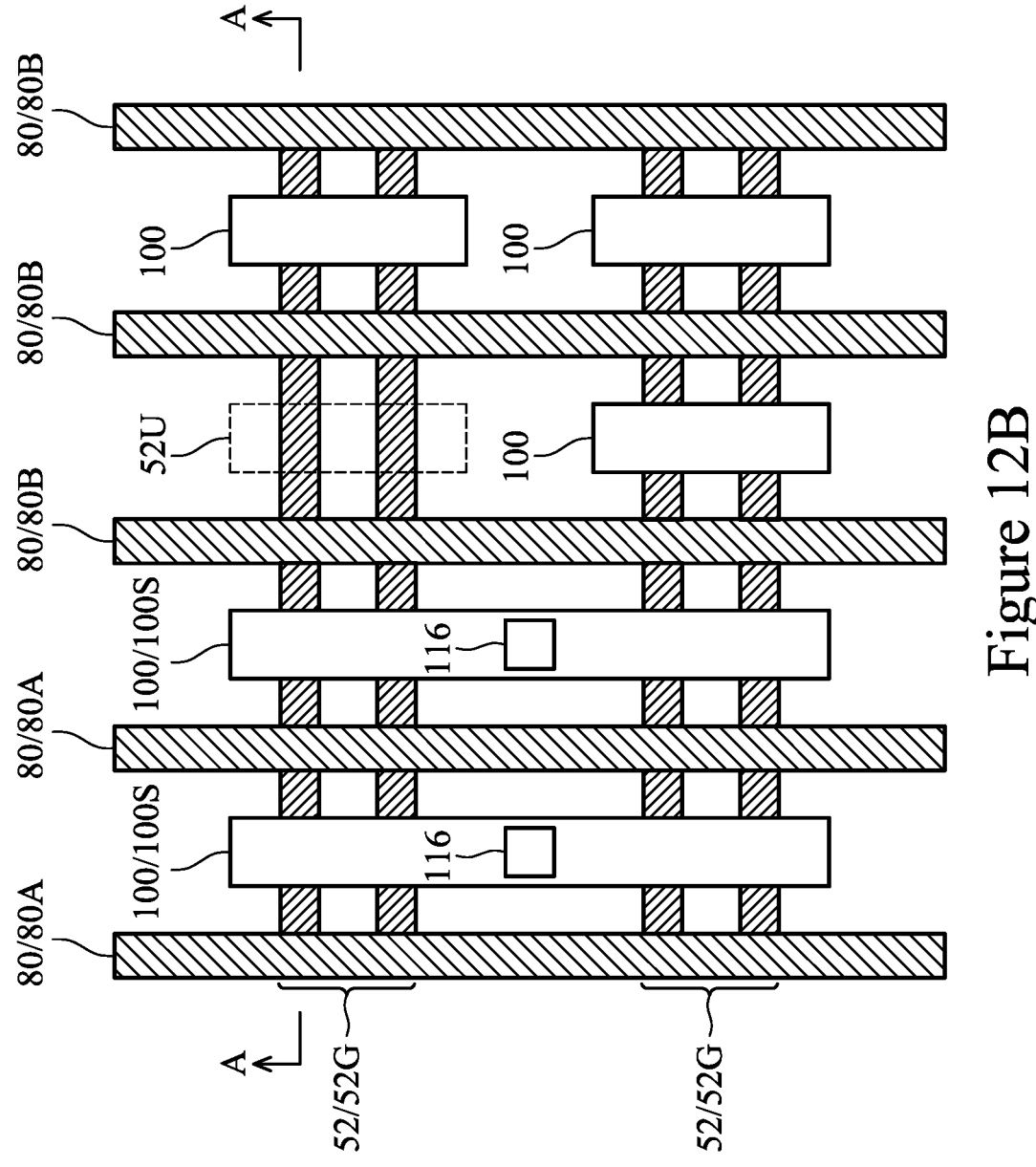

FIGS. 11A through 12B are various views of further intermediate stages in the manufacturing of FinFETs, in accordance with some embodiments. FIGS. 11A and 11B show a structure at a similar processing step as that shown in FIGS. 6A and 6B. In this embodiment, a fin group 52G (or a fin 52S, see FIG. 2D) is crossed by a single trim portion 92T instead of two trim portions 92T. Thus, the cut openings 94 defined on either side of the trim portion 92T are irregular cut openings 94N. FIGS. 12A and 12B show a structure at a similar processing step as that shown in FIGS. 10A and 10B. The unused regions 52U of the fins 52 can be bordered on all sides by lower source/drain contacts 100.

Figure 13A:
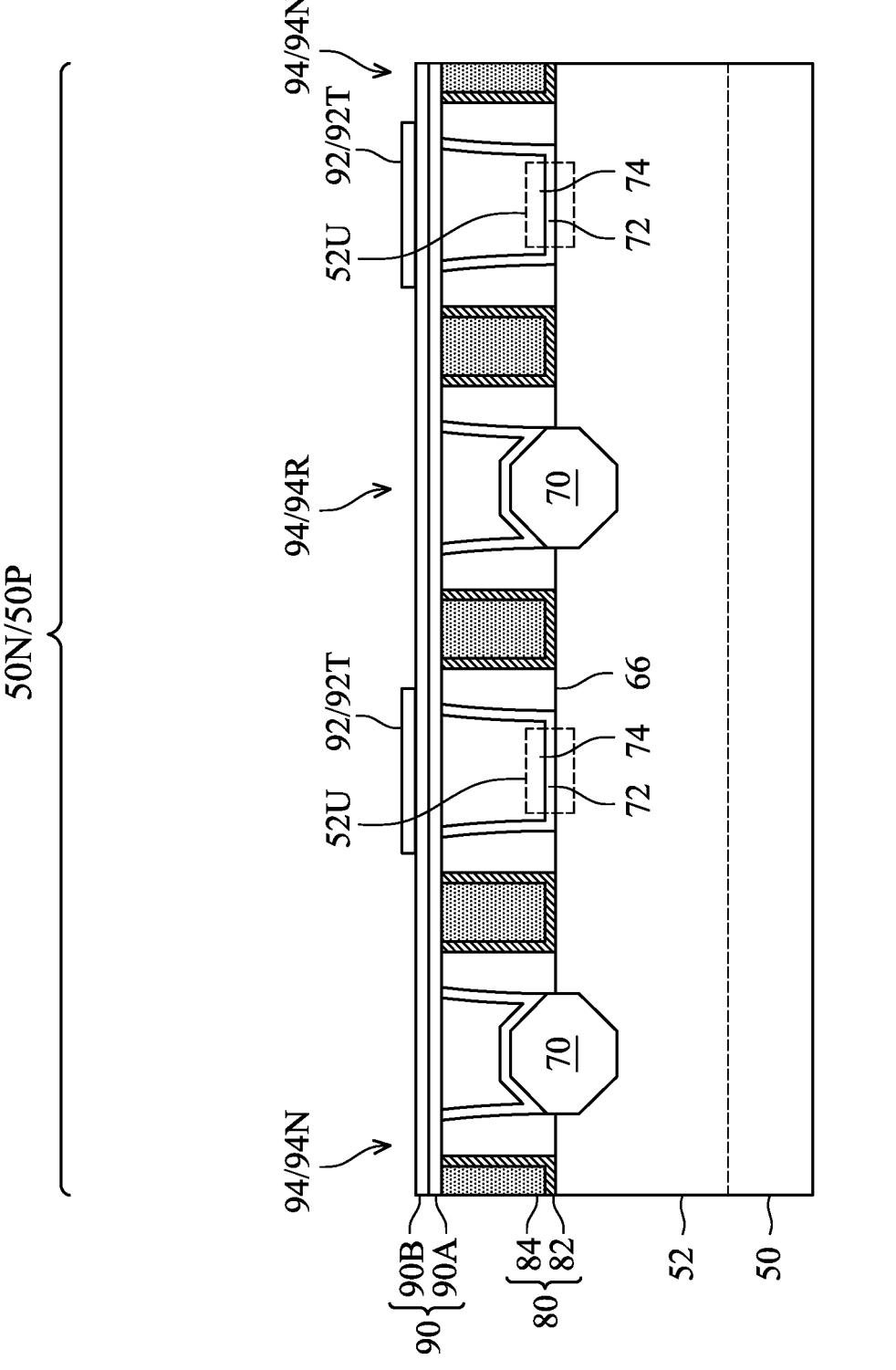
FIGS. 13A through 15B are various views of further intermediate stages in the manufacturing of FinFETs, in accordance with some other embodiments.
Figure 13B:
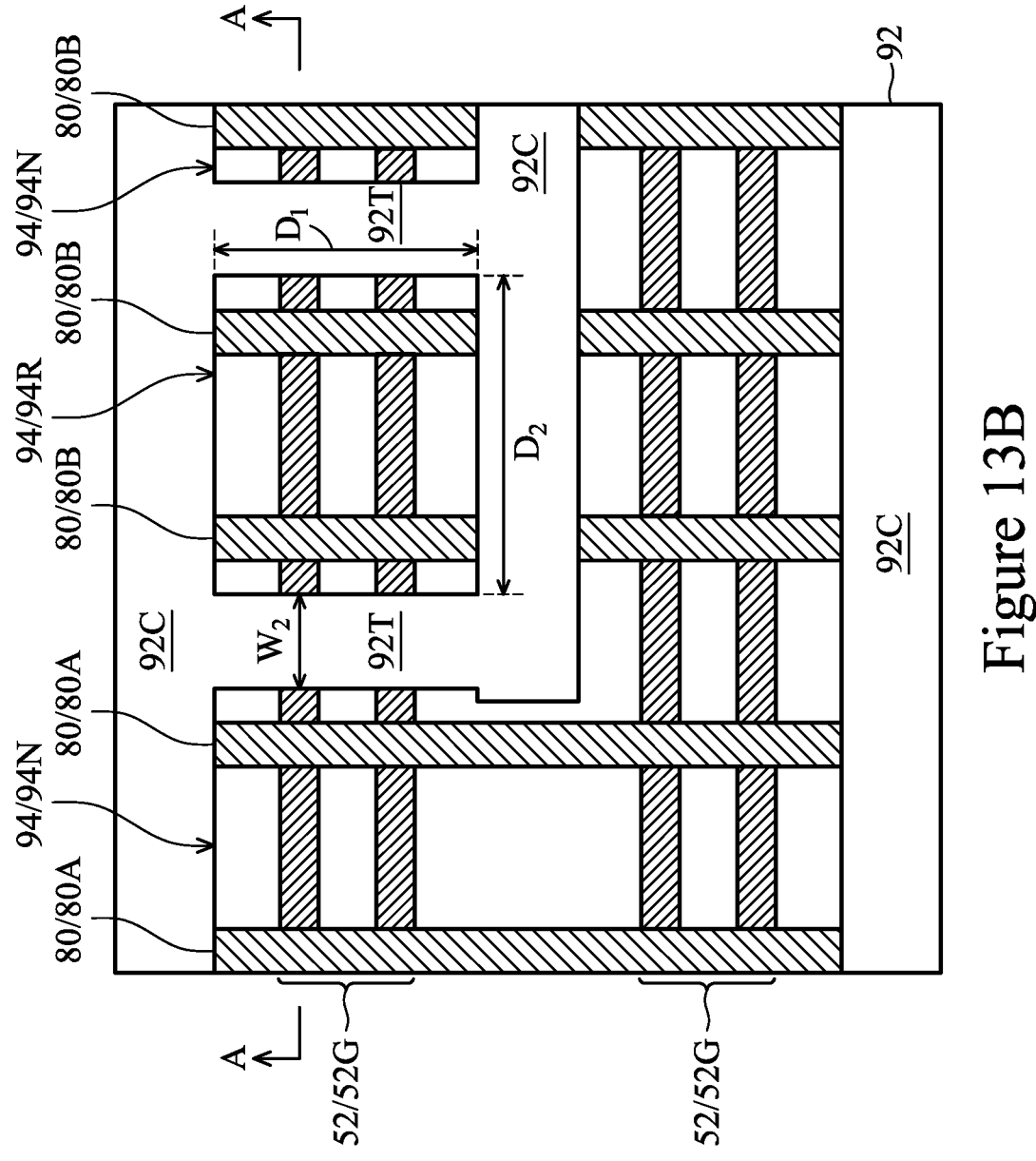
Figure 14A:
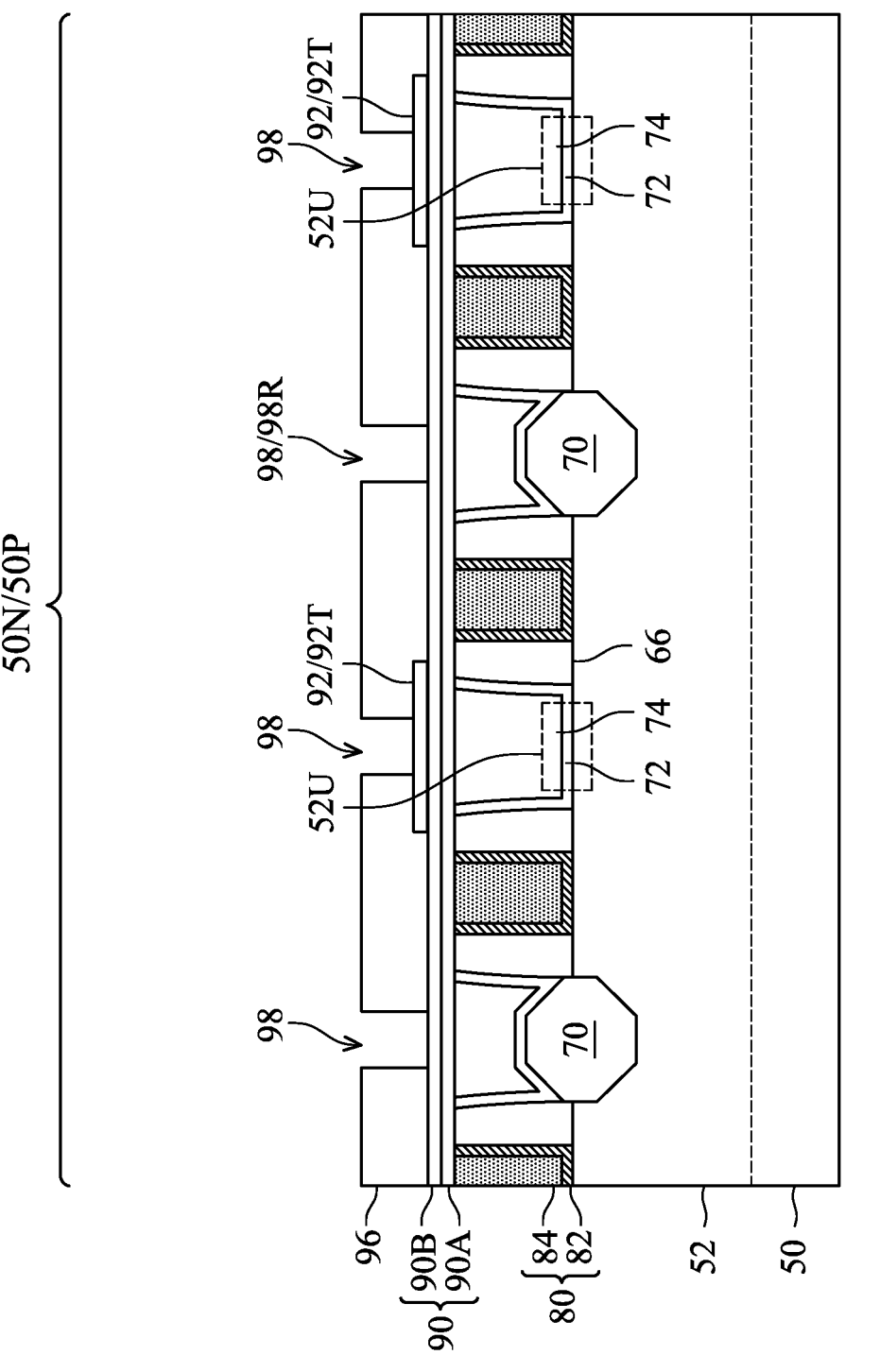
Figure 14B:
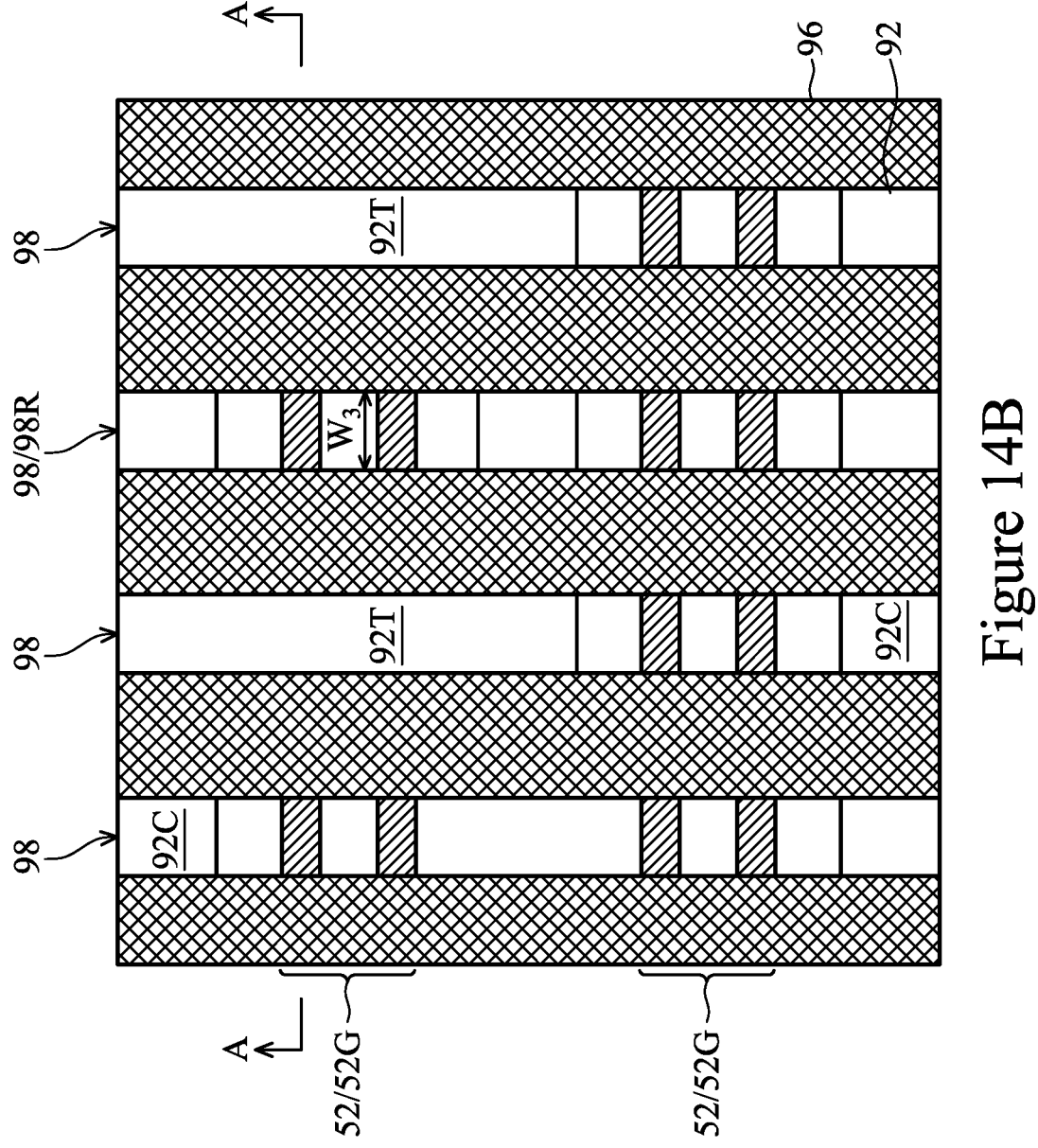
Figure 15A:
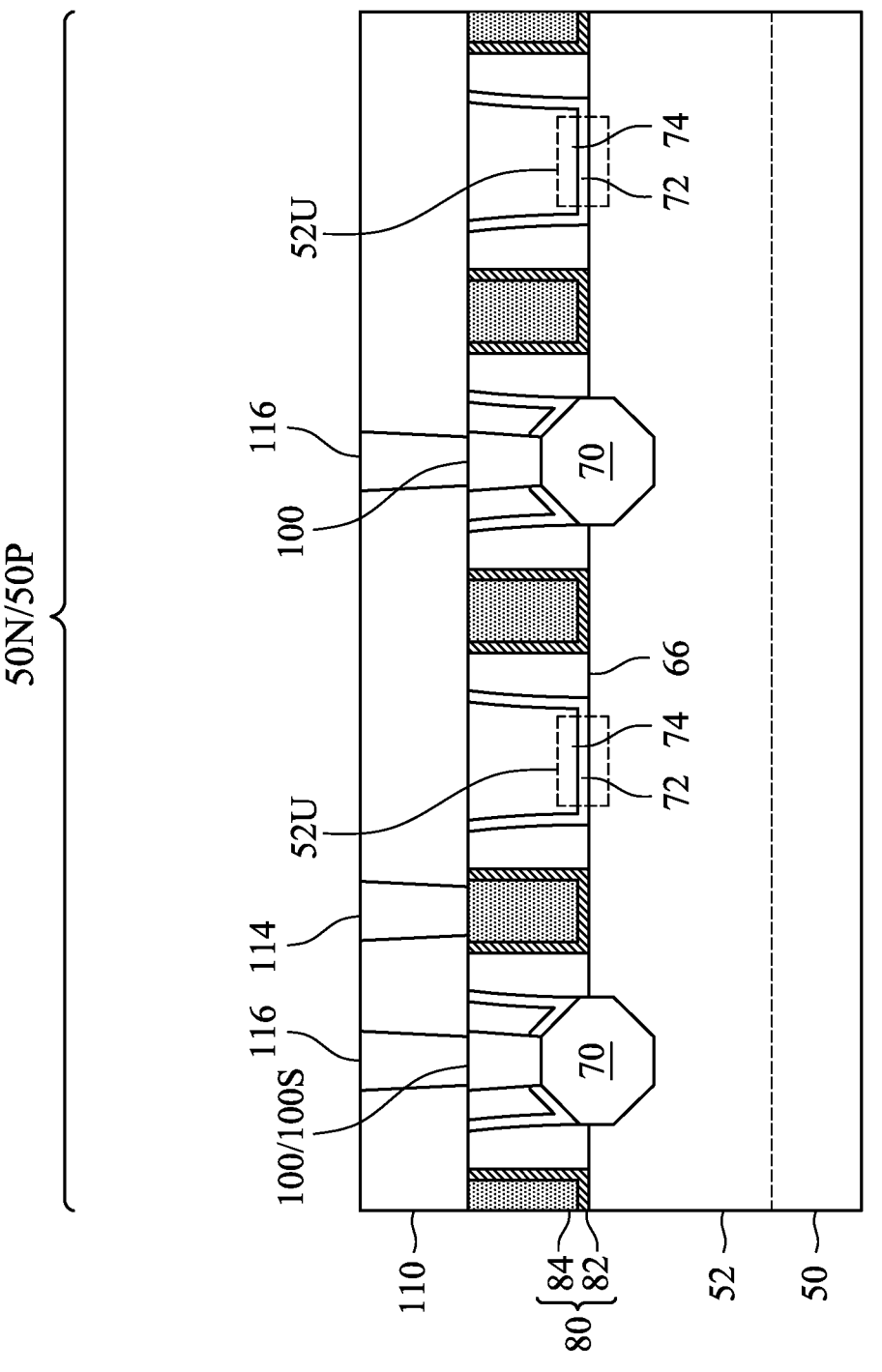
Figure 15B:
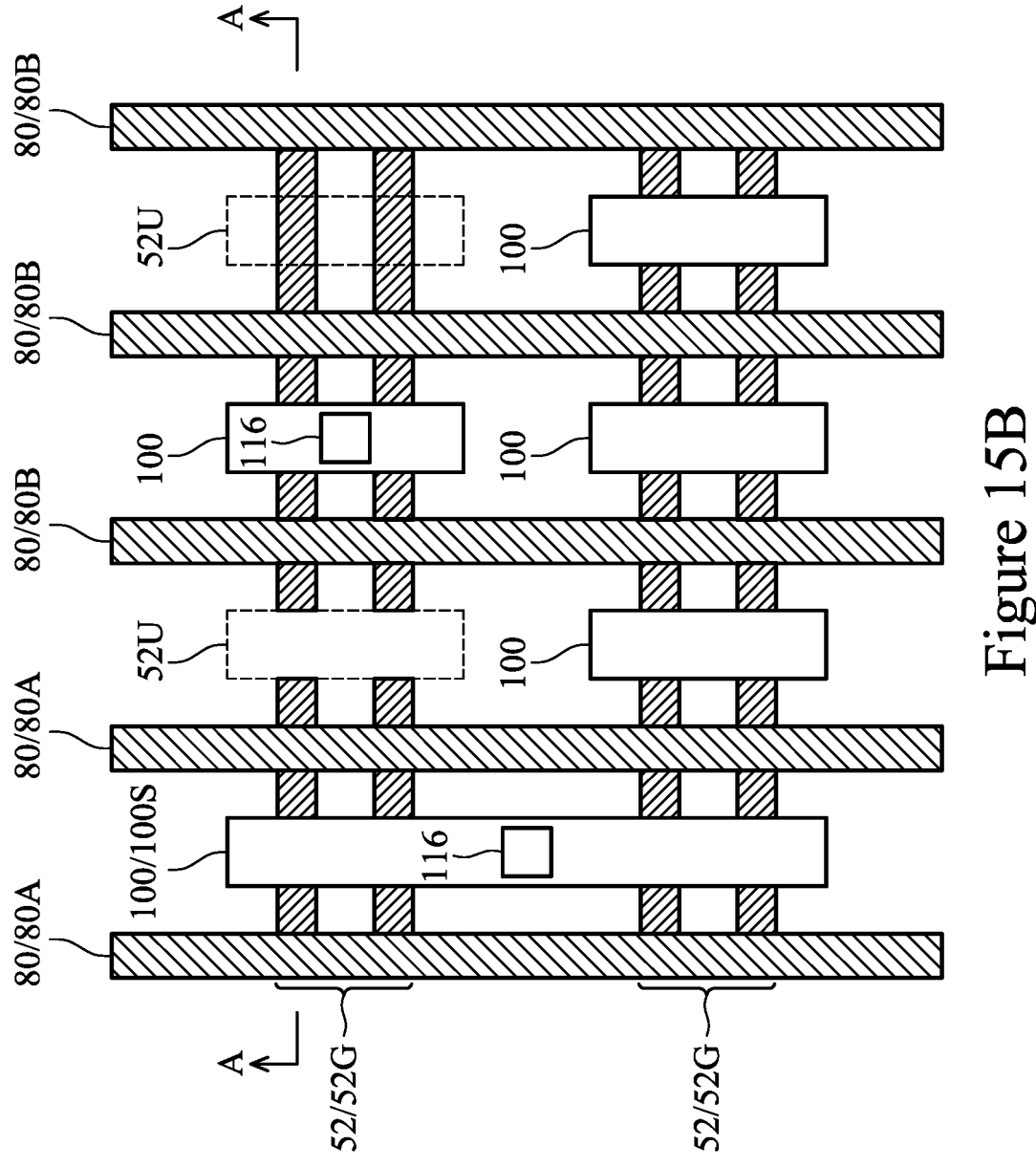

FIGS. 13A through 15B are various views of further intermediate stages in the manufacturing of FinFETs, in accordance with some embodiments. FIGS. 13A and 13B show a structure at a similar processing step as that shown in FIGS. 6A and 6B. In this embodiment, a fin group 52G (or a fin 52S, see FIG. 2D) is crossed by two trim portions 92T, and the distance $D_2$ between the trim portions 92T is larger, so that the openings 94R can be large enough to accommodate the formation of a lower source/drain contact 100 for an underlying epitaxial source/drain region 70. In this embodiment, the distance $D_2$ can be greater than the distance $D_1$. Specifically, the trim portions 92T can be close enough that the openings 94R are large enough to accommodate the formation of a single lower source/drain contact 100 for a single epitaxial source/drain region 70. FIGS. 14A and 14B show a structure at a similar processing step as that shown in FIGS. 7A and 7B. In this embodiment, the centers of the openings 94R can be aligned with the centers of a corresponding slot opening 98R. FIGS. 15A and 15B show a structure at a similar processing step as that shown in FIGS. 10A and 10B. As shown, one lower source/drain contact 100R is formed in the area defined by the opening 94R. Specifically, the lower source/drain contact 100R and its corresponding epitaxial source/drain region 70 are laterally disposed between neighboring pairs of the unused regions 52U of the fins 52.

In an embodiment, a method includes: forming a first fin extending from a semiconductor substrate; growing a source/drain region in the first fin; forming a metal gate over the first fin, the metal gate disposed between the source/drain region and a first dummy region of the first fin; depositing an inter-layer dielectric (ILD) layer over the source/drain region and the first dummy region; forming a cut mask over the ILD layer, the cut mask having a first cut portion, a second cut portion, and a first trim portion, the first cut portion and the second cut portion each extending along a longitudinal axis of the first fin, the first fin laterally disposed between the first cut portion and the second cut portion, the first trim portion connecting the first cut portion to the second cut portion, the first trim portion disposed over the first dummy region; patterning a contact opening in the ILD layer using the cut mask as an etching mask, portions of the ILD layer beneath the first trim portion remaining over the first dummy region after the patterning; and forming a source/drain contact in the contact opening, the source/drain contact coupled to the source/drain region.

In some embodiments, the method further includes: forming a second fin extending from the semiconductor substrate, where the second fin is laterally disposed between the first cut portion and the second cut portion of the cut mask; growing the source/drain region in the second fin; and forming the metal gate over the second fin, the metal gate disposed between the source/drain region and a second dummy region of the second fin, where the first trim portion of the cut mask is disposed over the second dummy region. In some embodiments, the method further includes: forming a contact etch stop layer (CESL) over the source/drain region and the first dummy region, where the ILD layer is deposited over the CESL; and etching the contact opening through the CESL, where the CESL physically contacts and extends across the first dummy region after etching the contact opening. In some embodiments of the method, patterning the contact opening in the ILD layer using the cut mask as the etching mask includes: forming a line mask over the cut mask, the line mask including a first slot opening, the first slot opening disposed over the source/drain region, the first slot opening exposing the first cut portion and the second cut portion of the cut mask; and etching the contact opening in portions of the ILD layer exposed by the first slot opening and uncovered by the first cut portion and the second cut portion of the cut mask. In some embodiments of the method, the line mask includes a second slot opening, the second slot opening disposed over the first dummy region, the second slot opening exposing the first trim portion of the cut mask, and further including: etching portions of the ILD layer exposed by the second slot opening and uncovered by the first trim portion of the cut mask. In some embodiments of the method, the first trim portion of the cut mask has a first width, the second slot opening has a second width, and the first width is greater than the second width. In some embodiments of the method, the cut mask has a second trim portion, the second trim portion connecting the first cut portion to the second cut portion, the second trim portion disposed over a second dummy region of the first fin, where portions of the ILD layer beneath the second trim portion remain over the second dummy region after the patterning. In some embodiments of the method, the first cut portion is separated from the second cut portion by a first distance, the first trim portion is separated from the second trim portion by a second distance, and the second distance is greater than the first distance. In some embodiments of the method, the first distance is in a range of 30 nm to 42 nm, and the second distance is in a range of 50 nm to 100 nm.

In an embodiment, a method includes: forming fins extending from a semiconductor substrate; depositing an inter-layer dielectric (ILD) layer on the fins; forming masking layers on the ILD layer; forming a cut mask on the masking layers, the cut mask including a first dielectric material, the cut mask having first openings exposing the masking layers, each of the first openings surrounded on all sides by the first dielectric material; forming a line mask on the cut mask and in the first openings, the line mask having slot openings, the slot openings exposing portions of the cut mask and portions of the masking layers, the slot openings being strips extending perpendicular to the fins; patterning the masking layers by etching the portions of the masking layers exposed by the first openings and the slot openings; and etching contact openings in the ILD layer using the patterned masking layers as an etching mask.

In some embodiments of the method, the first dielectric material is silicon nitride, and the masking layers include a titanium nitride layer and a silicon oxide layer, the titanium nitride layer disposed between the ILD layer and the silicon oxide layer. In some embodiments of the method, patterning the masking layers includes: etching the silicon oxide layer with a dry etching process, where the dry etching process etches the silicon oxide layer at a greater rate than the cut mask; and etching the titanium nitride layer with a wet etching process, where the wet etching process etches the titanium nitride layer at a greater rate than the cut mask. In some embodiments of the method, the dry etching process is performed with an etchant including $CF_4$, $CH_2F_2$, or $CHF_3$. In some embodiments of the method, the wet etching process is performed with an etchant including dilute hydrofluoric acid, de-ionized water, or a combination of de-ionized water, ammonia water, and aqueous $H_2O_2$. In some embodiments of the method, one of the first openings has a first center, one of the slot openings has a second center, and the first center is aligned with the second center. In some embodiments of the method, a first subset of the first openings are surrounded on four sides by straight segments of the first dielectric material. In some embodiments of the method, a second subset of the first openings are surrounded on more than four sides by straight segments of the first dielectric material.

In an embodiment, a structure includes: a semiconductor substrate having a major surface; a first fin extending from the semiconductor substrate, the first fin having a first longitudinal axis along a first direction, the first direction parallel to the major surface of the semiconductor substrate; a source/drain region in the first fin; a first metal gate over the first fin, the first metal gate disposed between the source/drain region and a dummy region of the first fin; a second metal gate over the first fin, the dummy region disposed between the second metal gate and the first metal gate; a contact etch stop layer (CESL) over the source/drain region and the dummy region, the CESL physically contacting and extending continuously along the dummy region; a first inter-layer dielectric (ILD) layer over the CESL; and a first source/drain contact extending through the first ILD layer and the CESL, the first source/drain contact physically contacting the source/drain region, the first source/drain contact having a width and a length, the length being greater than the width, the length being measured along a second direction, the second direction being parallel to the major surface of the semiconductor substrate, the second direction being perpendicular to the first direction.

In some embodiments, the structure further includes: a second ILD layer over the first ILD layer and the first source/drain contact; and an second source/drain contact extending through the second ILD layer, the second source/drain contact physically contacting the first source/drain contact. In some embodiments, the structure further includes: a first gate spacer adjacent the first metal gate; and a second gate spacer adjacent the second metal gate, where no conductive features are disposed in portions of the CESL and the first ILD layer disposed over the first fin and between the first gate spacer and the second gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

depositing an inter-layer dielectric over a first fin;

forming a cut mask over the inter-layer dielectric, the cut mask comprising a first cut portion, a second cut portion, and a first trim portion, the first cut portion and the second cut portion each extending parallel to the first fin without overlapping the first fin, the first fin disposed between the first cut portion and the second cut portion, the first trim portion connecting the first cut portion to the second cut portion, the first trim portion disposed over the first fin, the first trim portion having a first width, the first cut portion having a first length, the second cut portion having a second length, the first width being less than the first length and less than the second length, wherein the first width, the first length, and the second length are each measured along a direction parallel to a longitudinal axis of the first fin;

patterning a contact opening in the inter-layer dielectric using the cut mask as an etching mask; and forming a source/drain contact in the contact opening.

2. The method of claim 1, further comprising:

growing a source/drain region in the first fin and in a second fin, the second fin disposed between the first cut portion and the second cut portion of the cut mask; and forming a gate structure over the first fin and the second fin, the gate structure disposed adjacent the source/drain region.

3. The method of claim 2, further comprising:

forming a contact etch stop layer over the source/drain region and a first dummy region of the first fin, wherein the inter-layer dielectric is deposited over the contact etch stop layer, wherein the contact etch stop layer physically contacts and extends across the first dummy region after patterning the contact opening.

4. The method of claim 2, wherein patterning the contact opening comprises:

forming a line mask over the cut mask, the line mask comprising a first slot opening, the first slot opening disposed over the source/drain region, the first slot opening exposing the first cut portion and the second cut portion of the cut mask; and etching the contact opening in a portion of the inter-layer dielectric exposed by the first slot opening and uncovered by the first cut portion and the second cut portion of the cut mask.

5. The method of claim 4, wherein the line mask further comprises a second slot opening, the second slot opening exposing the first trim portion of the cut mask, and patterning the contact opening further comprises:

etching a portion of the inter-layer dielectric exposed by the second slot opening and uncovered by the first trim portion of the cut mask.

6. The method of claim 5, wherein the second slot opening has a second width, and the second width is less than the first width.

7. The method of claim 1, wherein the cut mask further comprises a second trim portion, the second trim portion connecting the first cut portion to the second cut portion, the second trim portion disposed over the first fin.

8. The method of claim 7, wherein the first cut portion is separated from the second cut portion by a first distance, wherein the first trim portion is separated from the second trim portion by a second distance, and wherein the second distance is greater than the first distance.

9. The method of claim 7, wherein the first cut portion is separated from the second cut portion by a first distance, wherein the first trim portion is separated from the second trim portion by a second distance, and wherein the second distance is less than the first distance.

10. A method comprising:

depositing a dielectric layer over fins;

forming a cut mask over the dielectric layer, the cut mask comprising a first dielectric material, the cut mask having cut openings, each of the cut openings defined by segments of the first dielectric material;

forming a line mask over the cut mask and in the cut openings, the line mask having slot openings, the slot openings being strips extending perpendicular to the fins; and patterning the dielectric layer by etching portions of the dielectric layer exposed by both the cut openings and the slot openings.

11. The method of claim 10, wherein the first dielectric material is silicon nitride, the dielectric layer comprises a titanium nitride layer and a silicon oxide layer, and the silicon oxide layer disposed over the titanium nitride layer.

12. The method of claim 11, wherein patterning the dielectric layer comprises:

etching the silicon oxide layer with a dry etching process, wherein the dry etching process etches the silicon oxide layer at a faster rate than the cut mask; and etching the titanium nitride layer with a wet etching process, wherein the wet etching process etches the titanium nitride layer at a faster rate than the cut mask.

13. The method of claim 12, wherein the dry etching process is performed with an etchant comprising $CF_4$, $CH_2F_2$, or $CHF_3$.

14. The method of claim 12, wherein the wet etching process is performed with an etchant comprising dilute hydrofluoric acid.

15. The method of claim 10, wherein one of the cut openings has a first center, wherein one of the slot openings has a second center, and wherein the first center is aligned with the second center along a direction parallel to the fins.

16. The method of claim 10, wherein a first subset of the cut openings are defined by four straight segments of the first dielectric material.

17. The method of claim 16, wherein a second subset of the cut openings are defined by more than four straight segments of the first dielectric material.

18. A method comprising:

forming a masking layer over an inter-layer dielectric, the inter-layer dielectric disposed over a semiconductor fin;

forming a cut mask over the masking layer, the cut mask comprising a first cut portion, a second cut portion, and a first trim portion, the semiconductor fin disposed between the first cut portion and the second cut portion in a top-down view, the first trim portion connecting the first cut portion to the second cut portion, the first trim portion overlapping the semiconductor fin in the top-down view;

forming a line mask over the cut mask, the line mask comprising a slot opening, the slot opening overlapping the first trim portion in the top-down view;

patterning the masking layer using the line mask and the cut mask as a combined etching mask; and transferring a pattern of the masking layer to the inter-layer dielectric.

19. The method of claim 18, wherein the cut mask further comprises a second trim portion, the second trim portion connecting the first cut portion to the second cut portion, the second trim portion overlapping the semiconductor fin in the top-down view.

20. The method of claim 18, wherein a width of the first trim portion is greater than a width of the slot opening.

\* \* \* \* \*